(12) United States Patent
Sato et al.

(10) Patent No.: US 7,365,628 B2
(45) Date of Patent: Apr. 29, 2008

(54) SEMICONDUCTOR APPARATUS

(75) Inventors: Akihiro Sato, Gunma-ken (JP); Satoru Sekiguchi, Saitama (JP); Kiyokazu Kamado, Gunma-ken (JP); Makoto Tsubonoya, Gunma-ken (JP); Kiyoshi Mita, Gunma-ken (JP); Yoichi Nabeta, Gunma-ken (JP)

(73) Assignees: Sanyo Electric Co., Ltd., Oaska (JP); Kanto Sanyo Semiconductors Co., Ltd., Gunma (JP)

( * ) Notice: Subject to any disclaimer, the term of this patent is extended or adjusted under 35 U.S.C. 154(b) by 7 days.

(21) Appl. No.: 11/339,438

(22) Filed: Jan. 24, 2006

(65) Prior Publication Data

US 2006/0176137 A1    Aug. 10, 2006

(30) Foreign Application Priority Data

Jan. 24, 2005   (JP)   ............................ 2005-015818
Nov. 14, 2005   (JP)   ............................ 2005-329185

(51) Int. Cl.
*H01F 5/00*   (2006.01)

(52) U.S. Cl. ...................... 336/200; 336/232; 336/223

(58) Field of Classification Search ............... 336/200, 336/223, 232

See application file for complete search history.

(56) References Cited

U.S. PATENT DOCUMENTS 5,083,189 A * 1/1992 Sawaya ..................... 257/791
7,060,350 B2 * 6/2006 Takaya et al. ............. 428/323
7,202,790 B2 * 4/2007 Copeland et al. ......... 340/572.7

FOREIGN PATENT DOCUMENTS

JP        2002-093847        3/2002

\* cited by examiner

*Primary Examiner*—Anh Mai
(74) *Attorney, Agent, or Firm*—SoCal IP Law Group LLP; Steven C. Sereboff; John E. Gunther

(57) ABSTRACT

A semiconductor apparatus having a semiconductor chip, a first coil electrically connected to the semiconductor chip and a first electrode electrically connected to the first coil is comprised of a second electrode which can be electrically connected to the first electrode as well as which can be electrically connected to a second coil on the outside of the semiconductor apparatus, and is characterized by that inductance composed of the first coil and the second coil is obtained by electrically connecting the second electrode to the first electrode and the second coil.

18 Claims, 10 Drawing Sheets

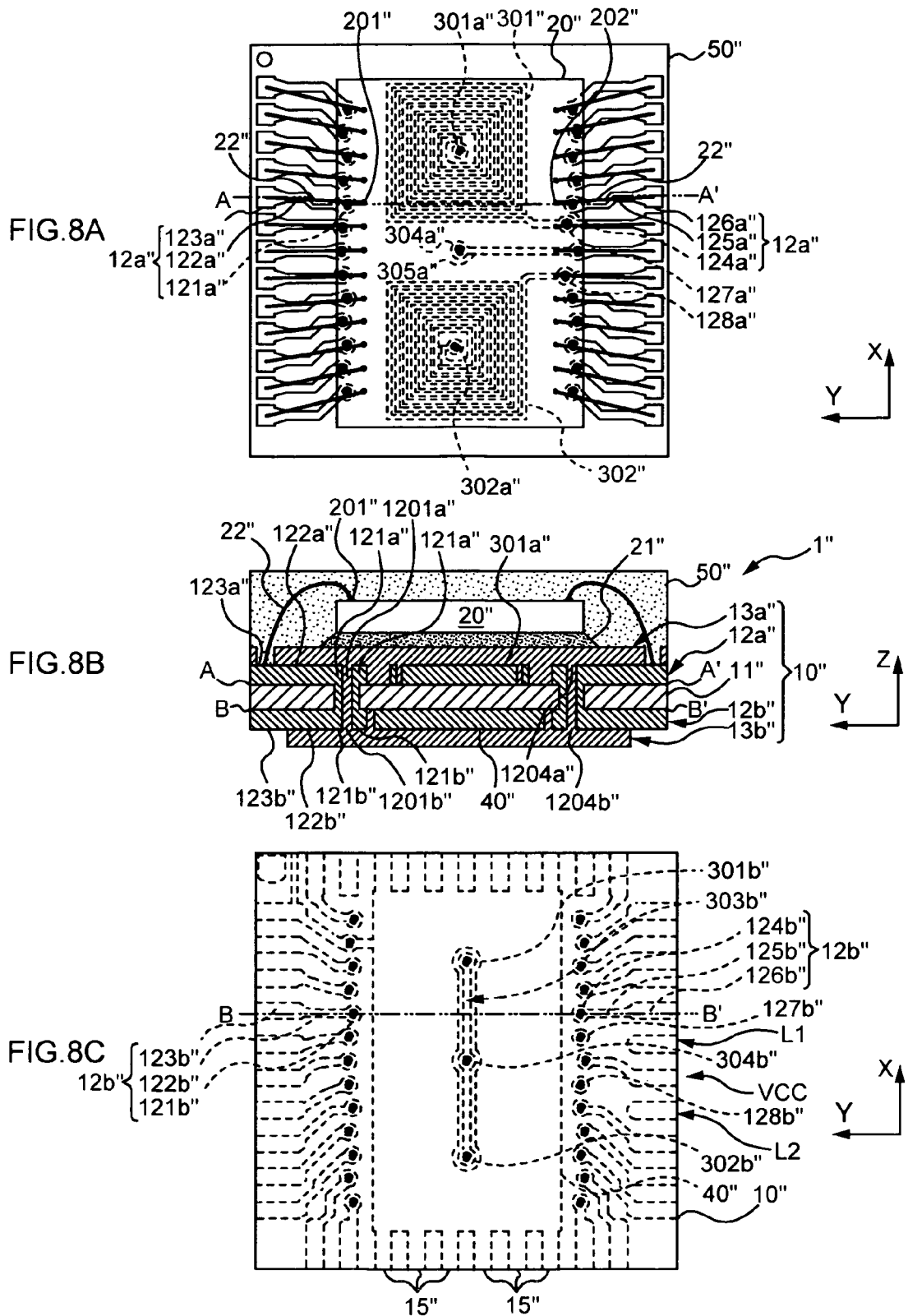

SEMICONDUCTOR APPARATUS

RELATED APPLICATION INFORMATION

The present application claims priority from Japanese Patent Applications Nos. 2005-15818 and 2005-329185 filed on Jan. 24, 2005 and Nov. 14, 2005 respectively, which are herein incorporated by reference.

BACKGROUND OF THE INVENTION

1. Field of the Invention

The present invention relates to a semiconductor apparatus having a coil.

2. Description of the Related Art

Recently, small-size electronic devices are widely spread, which are a cellular phone, a portable audio device, a PDA, a digital camera, etc. These electronic devices are demanded to be smaller, to have more functions, to have higher performance, etc. As a result, if an electronic device is manufactured, packaging technology, etc. are required for enabling higher density (see, e.g., Japanese Patent Application Laid-Open Publication No. 2002-93847).

In order to complying with such a requirement, recently, for example, an AM/FM tuner is constituted by one (1) package (semiconductor apparatus) and is provided as a commercial product which can be mounted on a portable electronic device. Although a package exists conventionally which stores almost all parts of a tuner as one (1) IC chip (semiconductor chip), for example, an inductor (coil), a varactor diode, etc. of a local oscillator circuit still must be mounted on a printed wiring substrate of an electronic device as an external part along with the package. In the package described here, an IC chip is electrically connected to a conductive path formed on the one side of a resin substrate and is then sealed with mold resin (insulating resin). On the contrary, recently, in order to store external parts into one (1) package, a pattern for a coil is formed on the other side (i.e., the under side of the package) of the substrate of the package, or a capacitor bank is incorporated into an IC chip, instead of a varactor diode which has relatively large dimensions. The capacitor bank is constituted by connecting a plurality of capacitors having capacities differentiated by a predetermined size in parallel and the frequency is changed by sequentially switching the capacities with the use of software. In this way, by using the recent so-called "one-chip" package, a portable electronic device can also be equipped with a function of a radio easily.

By the way, in general, in order to maintain a good frequency characteristic of a LC circuit of the above-described local oscillator circuit, etc., the inductance characteristic of the coil must be set to a predetermined value which maximize, for example, a Q value of the LC circuit to maintain the predetermined value at the time of operation of an electronic device, etc. to which a package is mounted. The inductance described here means the inductance of the coil provided along with the IC chip, etc. in the package mounted on a printed wiring substrate, for example.

However, due to mutual inductance coupling with circuit elements, etc. around the coil, the inductance of the coil may shift from a predetermined value set by, for example, the manufacturer of the package for single package at the time of shipping. With interference of inductive noise from circuit elements, etc. around the coil at the time of operation of the electronic device, etc., the inductance may shift from the predetermined value at the time of shipping.

SUMMARY OF THE INVENTION

The present invention was conceived in view of such problems. It is therefore the object of the present invention to provide a semiconductor apparatus which can set and maintain the inductance to a predetermined value when mounted.

In order to achieve the above object, according to a first aspect of the present invention there is provided a semiconductor apparatus comprising a semiconductor chip; a first coil electrically connected to the semiconductor chip; a first electrode electrically connected to the first coil; and a second electrode electrically connectable to the first electrode, the second electrode electrically connectable to a second coil on the outside of the semiconductor apparatus, wherein the second electrode is electrically connected to the first electrode and the second coil to obtain inductance composed of the first coil and the second coil.

To achieve the above object, according to a second aspect of the present invention there is provided a semiconductor apparatus comprising a substrate; a semiconductor chip disposed on one side of the substrate; a first coil formed in a spiral shape on the other side of the substrate and electrically connected to the semiconductor chip; a first electrode formed on the other side of the substrate and electrically connected to the first coil; and a second electrode formed on the other side of the substrate and electrically connectable to the first electrode, the second electrode electrically connectable to a second coil on the outside of the semiconductor apparatus, wherein the second electrode is electrically connected to the first electrode and the second coil to obtain inductance composed of the first coil and the second coil.

To achieve the above object, according to a third aspect of the present invention there is provided a semiconductor apparatus comprising a substrate; a semiconductor chip disposed on one side of the substrate; a first coil in a spiral shape formed on a surface of the one side of the substrate confronting the semiconductor chip, the first coil electrically connected to the semiconductor chip; a first electrode formed on a surface of the other side of the substrate and electrically connected to the first coil; and a second electrode formed on a surface of the other side of the substrate and electrically connectable to the first electrode, the second electrode electrically connectable to the second coil on the outside of the semiconductor apparatus, wherein the second electrode is electrically connected to the first electrode and the second coil to obtain inductance composed of the first coil and the second coil.

The semiconductor apparatus can thus be provided which is capable of setting and maintaining the inductance to a predetermined value when mounted.

Features and objects of the present invention other than the above will become apparent from the description of this specification and the accompanying drawings.

DESCRIPTION OF THE DRAWINGS

The above and other objects, aspects, features and advantages of the present invention will become more apparent from the following detailed description when taken in conjunction with the accompanying drawings, in which:

FIG. 8A is another plan view of the upper side of the semiconductor apparatus of the implementation;

FIG. 8B is another side view of the semiconductor apparatus of the implementation;

FIG. 8C is another perspective view of the under side of the semiconductor apparatus of the implementation seen from the upper side;

DETAILED DESCRIPTION OF THE INVENTION

At least the following matters will be made clear by the explanation in the present specification and the description of the accompanying drawings.

<<Configuration of Semiconductor Apparatus>>

Figure 1A:
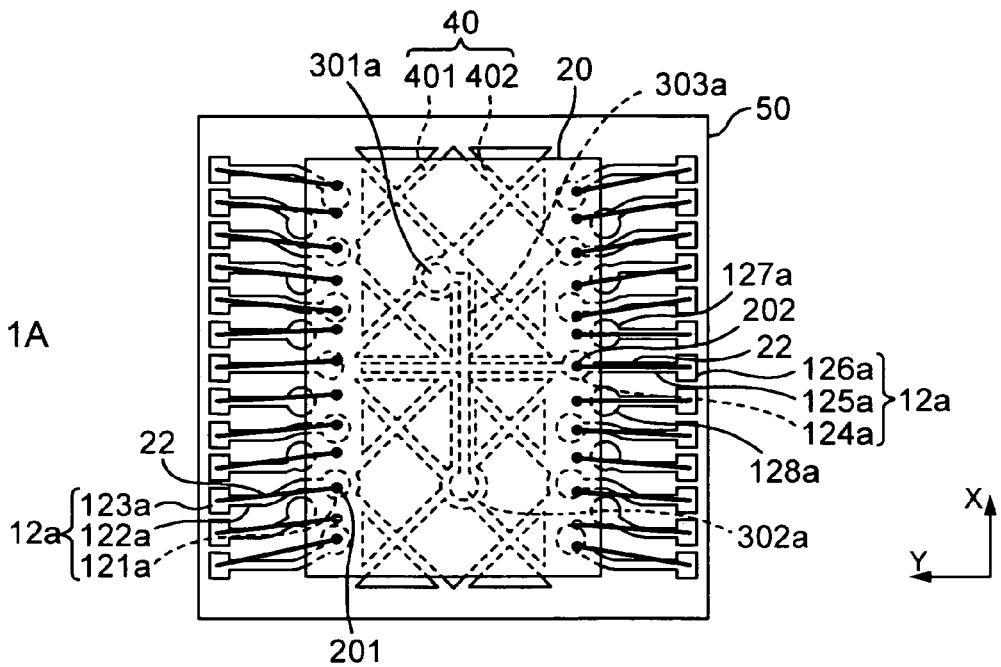
FIG. 1A is a plan view of the upper side of the semiconductor apparatus of the implementation.
Figure 1B:
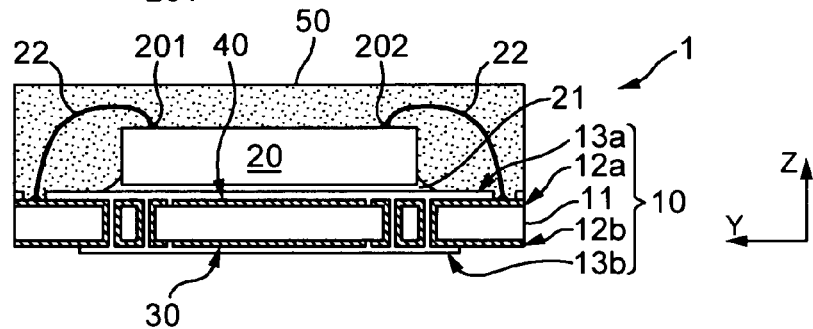
FIG. 1B is a side view of the semiconductor apparatus of the implementation.
Figure 1C:
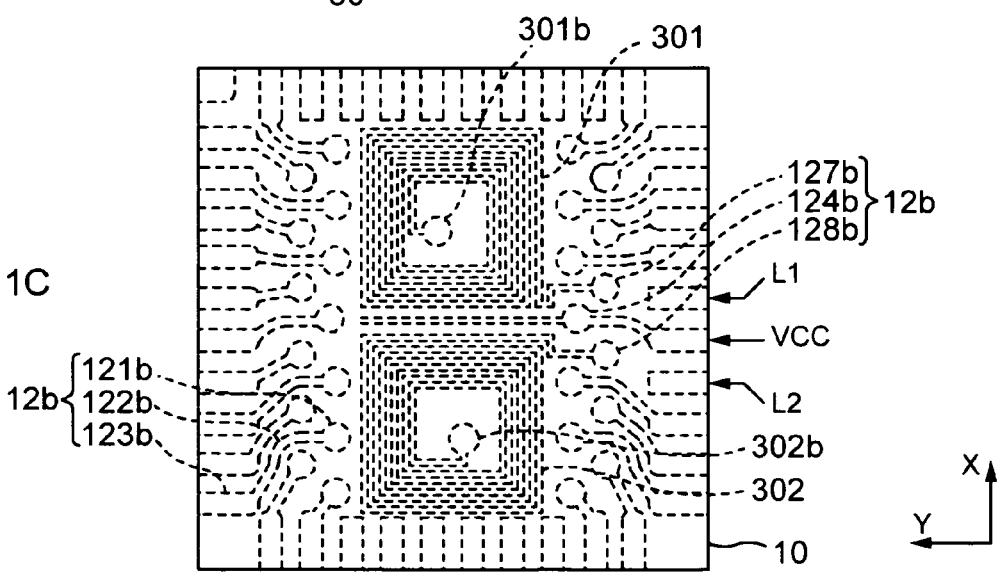
FIG. 1C is a perspective view of the under side of the semiconductor apparatus of the implementation seen from the upper side.

A configuration example of the implementation of a semiconductor apparatus 1 is described with reference to FIGS. 1A to 1C. FIG. 1A is a plan view of the upper side of the semiconductor apparatus 1; FIG. 1B is a side view of the semiconductor apparatus 1; and FIG. 1C is a perspective view of the under side of the semiconductor apparatus 1 seen from the upper side. Hereinafter, in this semiconductor apparatus 1, the side of an IC chip described later is referred to as the "upper side" and, in this semiconductor apparatus 1, the side of a coil described later is referred to as the "under side". As illustrated in FIG. 1A and FIG. 1C, the semiconductor apparatus 1 of the implementation is a package with the upper and under sides which are an approximate square shape, for example. A length of a side of the approximate square is on the order of 5 mm, for example. A thickness (length in the Z direction) of the package illustrated in FIG. 1B is on the order of 1 mm, for example. Therefore, the semiconductor apparatus 1 of the implementation forms a shape of a flat plate having the approximate square upper and under sides. However, the semiconductor apparatus 1 is not limited to the approximate square flat plate shape having the dimensions described above.

As illustrated in FIGS. 1A to 1C, the semiconductor apparatus 1 is constituted by mainly comprising a substrate 10, an IC chip (semiconductor chip) 20, a coil (first coil) 30 and a dummy pattern (conductive pattern) 40. On the substrate 10, coil electrodes (first electrodes) 127b, 128b and adjustment terminals (second electrodes) L1, L2 are formed. The "adjustment" of the adjustment terminals L1, L2 means overall inductance adjustment of the semiconductor apparatus 1 in a circuit apparatus 100 (FIG. 4) on the user side, as described later.

With regard to the substrate 10, the main material is an insulating substrate 11 (FIG. 1B) made of, for example, glass epoxy, and a predetermined conductive path 12a (FIG. 1B) is affixed to the upper side thereof, which is coated thereon with an insulating solder resist pattern 13a (FIG. 1B). To the under side of the insulating substrate 11, a predetermined conductive path 12b (FIG. 1B) is affixed, which is coated thereon with an insulating solder resist pattern 13b (FIG. 1B). Through-holes (FIGS. 3A to 3C) are bored in the insulating substrate 11, penetrating between the upper side and under side.

As illustrated in FIG. 1A, the predetermined conductive path 12a affixed to the upper side is constituted by comprising 26 IC chip patterns and one (1) coil pattern, for example. Each IC chip pattern is constituted by a through-hole opening electrode (e.g., an opening electrode 121a), wiring (e.g., wiring 122a), and an internal electrode (e.g., an internal electrode 123a). The coil pattern is constituted by through-hole opening electrodes 301a, 302a for the coil and wring 303a in a cross shape.

As illustrated in FIG. 1C, the predetermined conductive path 12b affixed to the under side is constituted by comprising patterns corresponding to the above-described 26 IC chip patterns and opening electrodes 301b, 302b corresponding to the through-hole opening electrodes 301a, 302a for the coil described above. Except the coil electrodes 127b, 128b and the adjustment terminals L1, L2, each pattern is constituted by an opening electrode (e.g., an opening electrode 121b), wring (e.g., wiring 122b) and an external terminal (e.g., an external terminal 123b).

On the other hand, the coil electrode 127b and the adjustment terminal L1 are arranged adjacent to each other. Similarly, the coil electrode 128b and the adjustment terminal L2 are arranged adjacent to each other. In the implementation, the relationship between the coil electrodes 127b, 128b and the adjustment terminals L1, L2 is equivalent to, for example, the configuration of the opening electrode 121b and the external terminal 123b in the IC chip pattern described above which are not provided with the wiring 122b therebetween and which are separated from each other. In this way, the coil electrodes 127b, 128b and the adjustment terminals L1, L2 are adjacent to each other while being electrically insulated. Since the coil electrodes 127b, 128b have openings of the though-holes in the center as is the case with the opening electrodes 121b, 124b, a substantial area as a conductor is small and, therefore, the coil electrodes 127b, 128b do not act as input/output terminals for the outside on the under side of the semiconductor apparatus 1. On the contrary, the adjustment terminals L1, L2 are conductors having larger area to the degree of enabling electrical connection to the outside via a solder ball, etc.

The opening electrode 121a on the upper side and the opening electrode 121b on the under side of the through-hole are oppositely arranged on each side. Similarly, the opening electrode 127*a* and the coil electrode 127*b* are in the relationship of the upper side and the under side of the same through-hole, and the opening electrode 128*a* and the coil electrode 128*b* are in the relationship of the upper side and the under side of the same through-hole.

The IC chip 20 (FIGS. 1A and 1B) is, for example, a bear chip internally forming portions other than the coil of the semiconductor apparatus 1 of the implementation. As illustrated in FIG. 1A, the IC chip 20 is comprised of 13 electrodes 201, 202 on each of the left and right sides of the Y axis, for example. These 26 electrodes 201, 202 are electrically connected to 26 internal electrodes 123*a* respectively with metal thin lines 22. Although the IC chip 20 of the implementation has, for example, an approximate rectangular flat plate shape which is one size smaller than the approximate square of the above-described substrate 10, the present invention does not limited to this. For the IC chip 20 of the implementation, the number of the electrodes 201, 202 as well as the numbers of the internal electrodes, external terminals, etc. determined correspondingly are not limited to 26 as described above.

As illustrated in FIG. 1C, the coil 30 is composed of two (2) flat coils 301, 302 in a spiral shape affixed to the insulating substrate 10, as a portion of the under-side conductive path 12*b* described above. The coil 301 and the coil 302 are connected to the wring 303*a* in a cross shape such that the opening electrodes 301*b*, 302*b* (FIG. 1C) and the opening electrodes 301*a*, 302*a* (FIG. 1A) described above have the same electric potential. The wiring 303*a* in a cross shape is electrically connected to the electrode 202 of the IC chip 20 via the wiring 125*a*, the internal electrode 126*a* and the metal thin line 22. On the other hand, this wiring 303*a* in a cross shape is connected to an external terminal VCC (FIG. 1C) via the opening electrode 124*a* (FIG. 1A) and the opening electrode 124*b* (FIG. 1C) to have the same electric potential.

In the implementation, the electrodes of two (2) coils 301, 302 on one side are the opening electrodes 301*b*, 302*b* and the electrodes on the other side are the coil electrodes 217*b*, 128*b*.

The entire surface of the under side of the substrate 10 is coated with the solder resist pattern 13*b* described above, except 24 external terminals, two (2) adjustment terminals and the coil electrodes 127*b*, 128*b* described above.

The dummy pattern 40 may consist of an integral flat conductor, for example. However, a particular effect described later is achieved by the dummy pattern 40 constituted by arranging a plurality of conductors spaced by predetermined narrow gaps.

As illustrated in FIG. 1A, the dummy pattern 40 of the implementation is formed on the upper side of the insulating substrate 10 oppositely to the coils 301, 302 on the under side of the insulating substrate 10. Specifically, the dummy pattern 40 of the implementation is constituted by arranging isolated conductors 401 made mainly of, for example, copper (Cu) in an approximate square shape spaced by narrow gaps (predetermined gaps) 402 such that an angle of about 45 degrees is formed relative to the side of the approximate rectangular of the IC chip 20. The approximate square shape and 45 degrees are an example. A plurality of gaps 402 has linear shapes orthogonal to each other, for example. Since a contour of the dummy pattern 40 is aligned to a contour of an approximate rectangular combining two (2) coils 301, 302, a portion of the conductors 401 in an approximate square shape has an approximate triangular shape near the contour. Since the conductors 401 of the dummy pattern 40 surround the above-described opening electrodes 301*a*, 302*a* and wiring 303*a* in a cross shape at a distance of the narrow gap, a portion of the conductors 401 in an approximate square shape has approximate triangular shape has, for example, an approximate triangular shape near the opening electrodes 301*a*, 302*a* and wiring 303*a*. These conductors 401 are affixed to the upper side of the insulating substrate 10 and are coated with the solder resist pattern 13*a*. To the solder resist pattern 13*a*, the IC chip 20 is fixed via an insulating paste (insulating adhesive) 21.

By the way, since the conductors 401 of the dummy pattern 40 forms a convex shape in the Z direction of FIG. 1B relative to the gap 402, the solder resist pattern 13*a* coating thereon also forms a similar convex/concave shape. When the semiconductor apparatus 1 is mounted on a printed wiring substrate 500 described later, the convex/concave shape leads to alleviation of stress acting on the semiconductor apparatus 1. As illustrated in FIG. 1A, since the gap 402 forming a concave shape relatively to the conductors 401 has a radial shape from the center of the XY plane of the substrate 10, the above-described insulating paste 21 can be easily applied; fugitivity of voids is increased at the time of application; and therefore, closeness and adhesiveness are improved between the dummy pattern 40 and the IC chip 20. Consequently, the IC chip 20 can be easily and certainly mounted when the semiconductor apparatus 1 is manufactured.

In the implementation, after the IC chip 20 is mounted on the substrate 10 with the dummy pattern 40 formed, the upper side of the substrate 10 is sealed with mold resin (insulating resin) 50.

Figure 2:
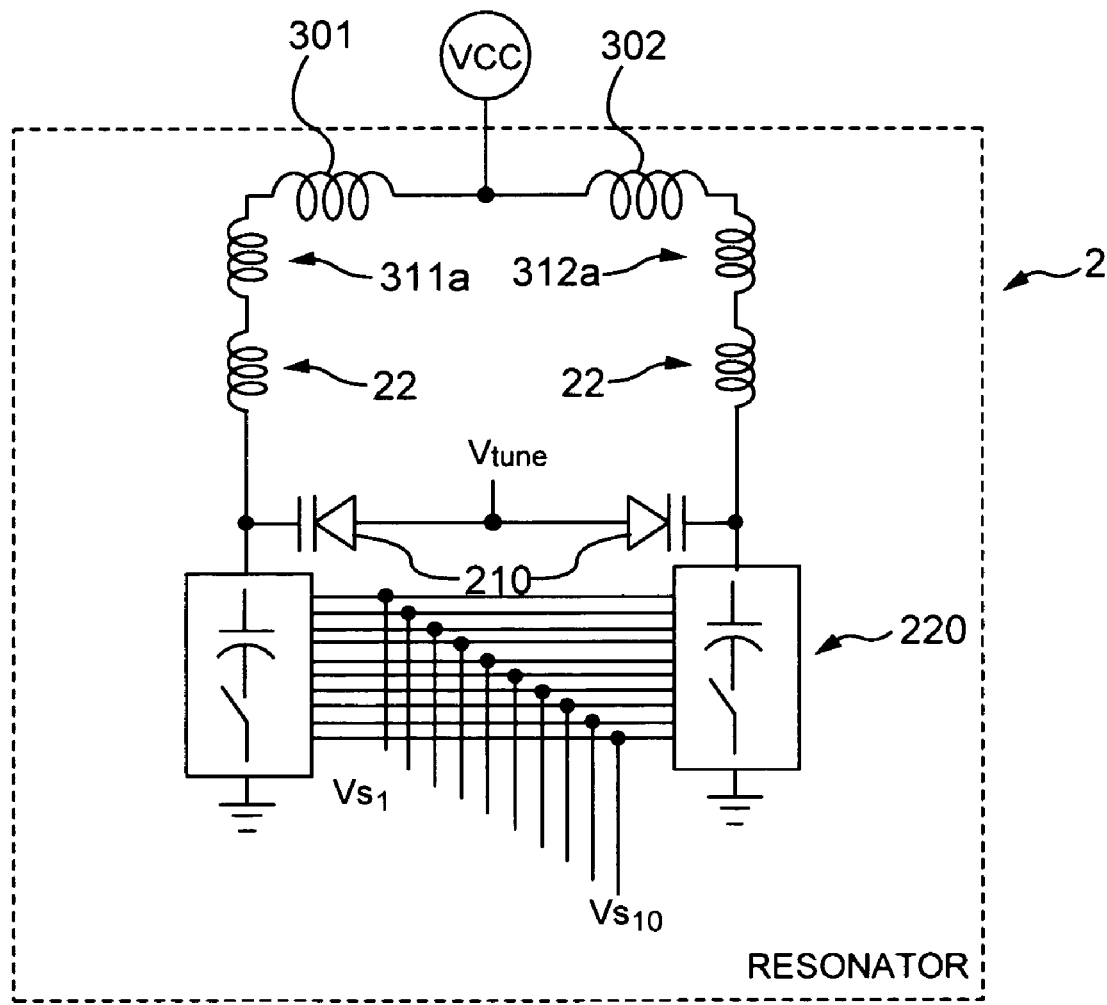
FIG. 2 is a circuit diagram showing an example of an equivalent circuit for a resonator of the semiconductor apparatus of the implementation.

As illustrated in a circuit diagram of FIG. 2, the semiconductor apparatus 1 of the implementation may be, for example, a tuner apparatus such that a portion of the IC chip 20 and the coils 301, 302 are equivalent to a resonator in a local oscillator circuit. In an equivalent circuit 2 illustrated in FIG. 2, the coils (inductors) 301, 302 illustrated in FIG. 1C are connected in series with each of inductors 311*a*, 312*a* originated from the package, such as the conductive paths 12*a*, 12*b*. To these inductors 311*a*, 312*a*, each of the metal thin lines 22, etc. is serially connected as inductors originated from wire bonding. However, in this implementation, the contribution of these inductors to the coils 301, 302 is on the order of 25%, for example.

As illustrated in FIG. 2, an internal diode 210 and a capacitor bank 220 are connected to each of the inductors 301, 311*a*, 22 and the inductors 302, 312*a*, 22. The internal diode 210 and the capacitor bank 220 are formed internally to the IC chip 20. The capacitor bank 220 of the implementation is constituted by connecting, for example, 10 capacitors having capacities differentiated by a predetermined size in parallel and the frequency is changed by sequentially switching the capacities with the use of software.

The semiconductor apparatus 1 of the implementation is not limited to the tuner apparatus described above. In the implementation, for the coil 301,302 formed in a spiral shape, the coils in the equivalent circuit 2 including the inductors 311*a*, 312*a*, the metal thin lines 22, etc. described above may correspond to the first coils.

Figure 3A:
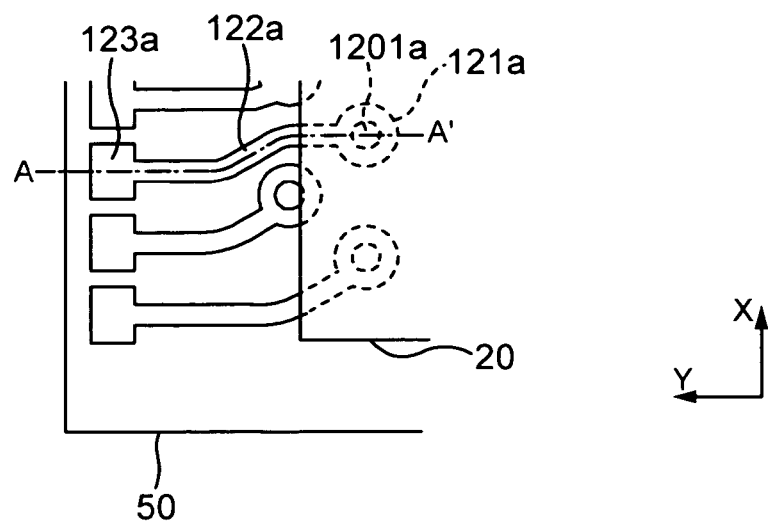
FIG. 3A is a plan view enlarging a portion of the semiconductor apparatus of the implementation.
Figure 3B:
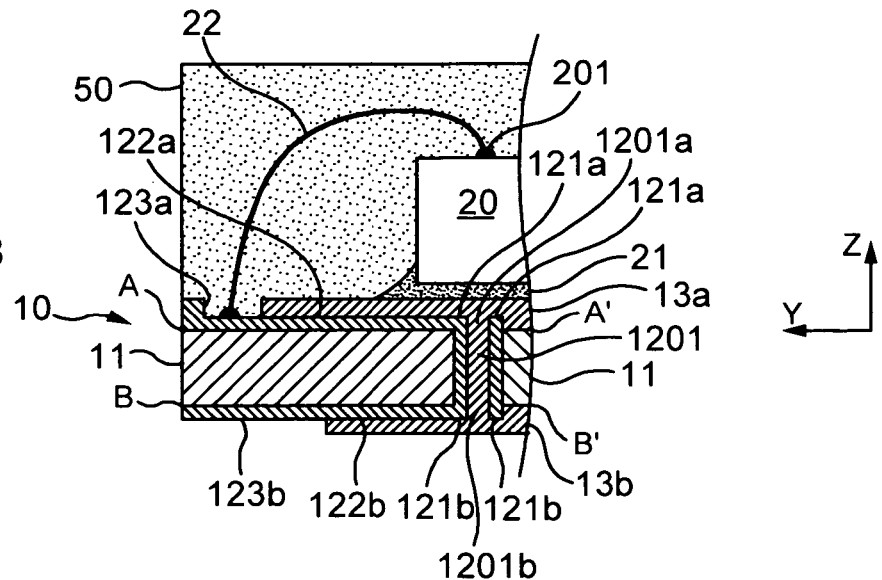
FIG. 3B is a sectional view enlarging a portion of the semiconductor apparatus of the implementation.
Figure 3C:
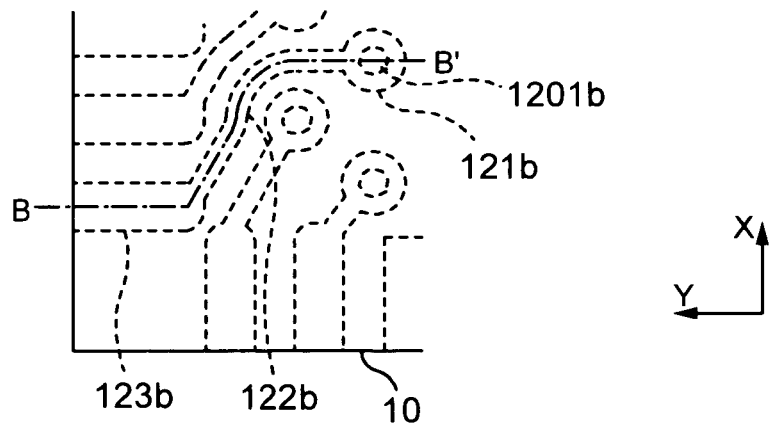
FIG. 3C is a perspective view enlarging a portion of the semiconductor apparatus of the implementation.

For an example of the electrical connection between the conductive paths 12*a*, 12*b* and the IC chip 20 in the semiconductor apparatus 1 of the implementation, more detail descriptions are made with reference to FIGS. 3A to 3C. FIG. 3A is an enlarged plan view of the lower left portion of the semiconductor apparatus 1 of FIG. 1A; FIG. 3B is an enlarged plan view of the left portion of the semiconductor apparatus 1 of FIG. 1B; and FIG. 3C is an enlarged perspective view of the lower left portion of the semiconductor apparatus 1 of FIG. 1C.

As illustrated in FIG. 3A, the above-described opening electrode 121a, wiring 122a and internal electrode 123a affixed to the upper side of the insulating substrate 11 are an integral conductor. When the conductor is cut along a curved line from A to A' of FIG. 3A and is looked from the X direction, the cross section corresponds to a portion of A-A' of FIG. 3B. As illustrated in FIG. 3B, the internal electrode 123a is exposed from a gap of the solder resist pattern 13a and, under the coating of the solder resist pattern 13a, the wiring 122a and the opening electrode 121a are connected to a through-hole 1201 coated therein with the similar conductor.

As illustrated in FIG. 3C, the above-described opening electrode 121b, wiring 122b and external terminal 123b affixed to the under side of the insulating substrate 11 are an integral conductor. When the conductor is cut along a curved line from B to B' of FIG. 3C and is looked from the X direction, the cross section corresponds to a portion of B-B' of FIG. 3C. As illustrated in FIG. 3B, the external terminal 123b is exposed from a gap of the solder resist pattern 13b and, under the coating of the solder resist pattern 13b, the wiring 122b and the opening electrode 121b are connected to the through-hole 1201 described above.

From the description above, the internal electrode 123a and the external terminal 123b are electrically connected via the through-hole 1201 having openings 1201a, 1201b on each opposing side of the substrate 10. On the other hand, as illustrated in FIG. 3B, the internal electrode 123a is electrically connected to the electrode 201 of the IC chip 20 via the metal thin line 22. Therefore, the external terminal 123b acts as a terminal of the IC chip 20 in the semiconductor apparatus 1.

A connection example between the conductive paths 12a, 12b via another through-hole is the same as the example illustrated in FIGS. 3A to 3C. In the implementation, through-holes relevant to the opening electrodes 124a, 127a, 128a, 301a, 302a illustrated in FIG. 1A correspond to the through-holes electrically connecting the coil 30 and the IC chip 20. The inside of each through-hole of the implementation is sealed with the solder resist.

<<Circuit Apparatus>>

-Inductance Adjustment-

According to the equivalent circuit 2 (FIG. 2), since the input from the outside to the coils 301, 302 only exits as the input via the external terminal VCC, when the semiconductor apparatus 1 with the above-described configuration is incorporated into a portable electronic device, etc. and is operated, in principle, only the external terminal VCC will be an electric connection destination from, for example, a printed wiring substrate to the coils 301, 302. However, if the semiconductor apparatus 1 is electrically connected to the printed wiring substrate also via other external terminals (e.g., external terminal 123b), the inductance may be shifted from inductance (i.e., inductance set by the manufacturer of the semiconductor apparatus 1) of only the inductors 311a, 312a, the metal thin lines 22, etc. (which are the first coil, FIG. 2) originated from the package. Therefore, as described later, in the semiconductor apparatus 1 with the above-described configuration, the inductance can be adjusted by externally connecting second coils 801, 802 (see FIG. 5) in parallel with the first coils on the user side.

Figure 4A:
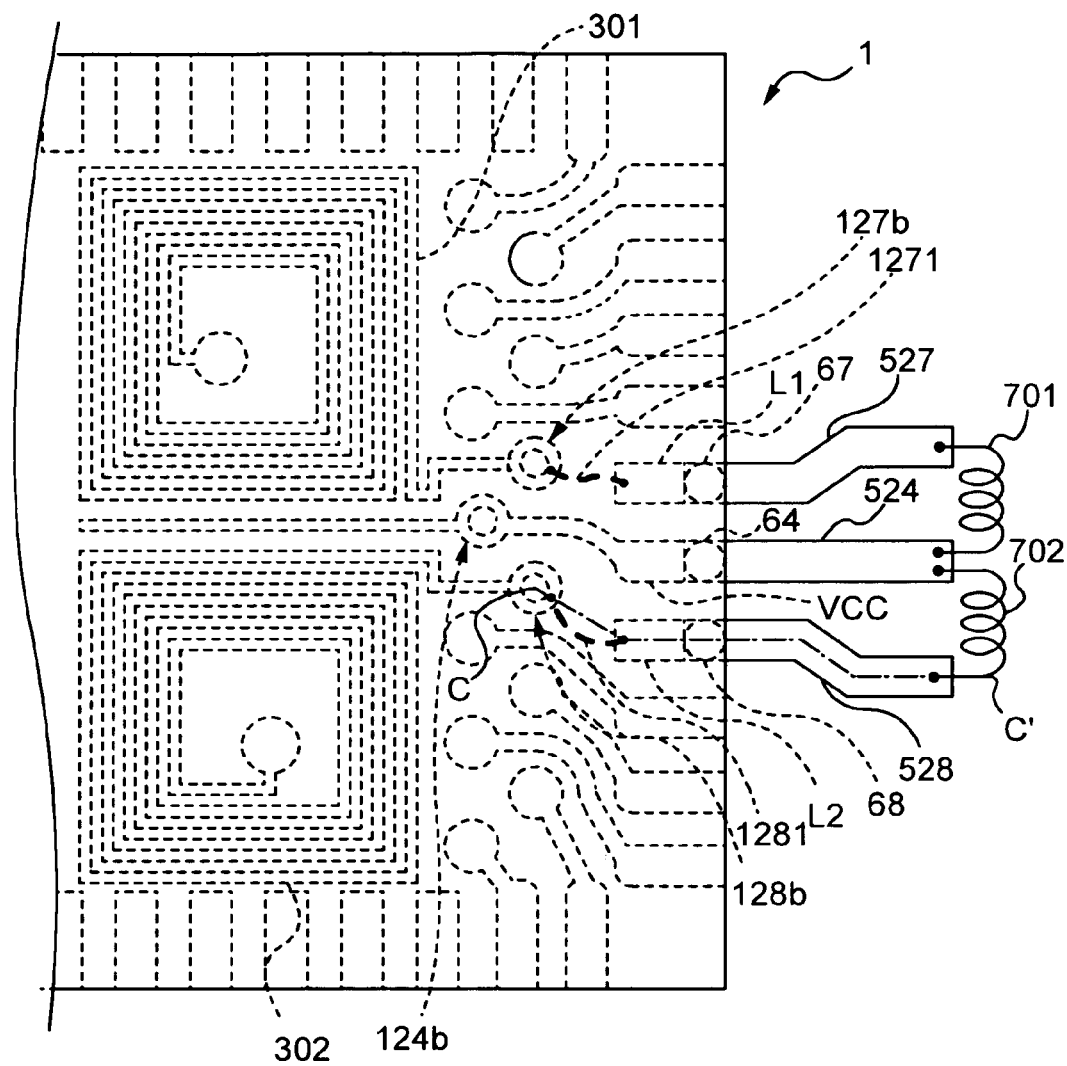
FIG. 4A is a plan view of a portion of a circuit apparatus of the implementation.
Figure 4B:
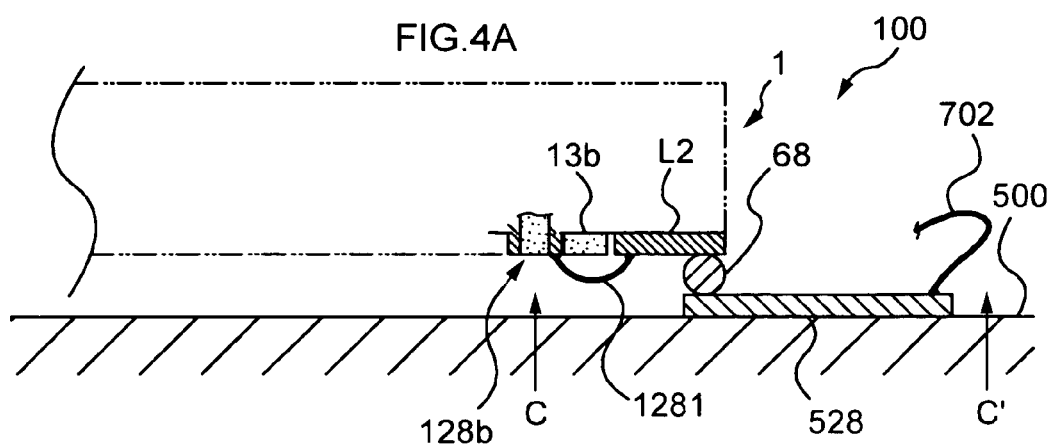
FIG. 4B is a sectional view of a portion of a circuit apparatus of the implementation.

With reference to FIGS. 4A and 4B, descriptions are made for the case of mounting the semiconductor apparatus 1 with the above-described configuration to the printed wiring substrate along with other circuit elements, etc. to form one (1) circuit apparatus of a portable electronic device, etc. FIG. 4A is a plan view of the upper side of the semiconductor apparatus 1 mounted to the printed wiring substrate 500 and FIG. 4B is a sectional view of the semiconductor apparatus 1 mounted to the printed wiring substrate 500. In other words, FIG. 4A is a plan view showing a portion of the circuit apparatus 100 of the implementation and FIG. 4B is a sectional view showing a portion of the circuit apparatus 100 of the implementation. As illustrated in FIG. 4B, the semiconductor apparatus 1 is mounted such that the under side thereof faces to the printed wiring substrate 500. On the printed wiring substrate 500, predetermined conductive paths are preliminary formed depending on the arrangement of the external terminals (e.g., external terminal 123b) on the under side of the semiconductor apparatus 1, and these external terminals are electrically connected to the predetermined conductive paths via solder balls, etc. The solder balls, etc. also serve to support the semiconductor apparatus 1 on the printed wiring substrate 500.

As illustrated in FIG. 4A, on the printed wiring substrate 500, a predetermined conductive path 524 is preliminary affixed, which should be electrically connected to the external terminal VCC of the semiconductor apparatus 1. Although the conductive path 524 of FIG. 4A and FIG. 4B is relatively short, this is for the convenience of illustration. In fact, since a voltage, etc. must be input from the outside to the semiconductor apparatus 1 via the conductive path 524 and the external terminal VCC, the conductive path 524 must extend to another circuit element, etc. on the printed wiring substrate 500. As illustrated in FIG. 4A, onto the printed wiring substrate 500, a conductive path 527 and a conductive path 528 are preliminary affixed which should be electrically connected to the adjustment terminal L1 and the adjustment terminal L2 of the semiconductor apparatus 1, respectively.

On the other hand, on the semiconductor apparatus 1, the coil electrode 127b and the adjustment terminal L1 are wire-bonded through a metal thin line 1271. The coil electrode 128b and the adjustment terminal L2 are wire-bonded through a metal thin line 1281. In this way, electric connection is formed respectively between the coil electrodes 127b, 128b and the adjustment terminals L1, L2 which are electrically insulated.

The semiconductor apparatus 1 is mounted onto the printed wiring substrate 500 such that: the external terminal 124b is electrically connected to the conductive path 524 via a solder ball 64; the adjustment terminal L1 is electrically connected to the conductive path 527 via a solder ball 67; and the adjustment terminal L2 is electrically connected to the conductive path 528 via a solder ball 68. FIG. 4B is a sectional view showing a cross section from C to C' of FIG. 4A in the circuit apparatus 100. As shown in the figure, the coil electrode 128b is electrically connected to the adjustment terminal L2 via the metal thin line 1281 and the adjustment terminal L2 is electrically connected to the conductive path 528 via the solder ball 68. Similarly, the coil electrode 127b is electrically connected to the conductive path 527 via the metal thin line 1271, the adjustment terminal L1 and the solder ball 67. The external terminal VCC is electrically connected to the conductive path 524 via the solder ball 64. On the printed wiring substrate 500, in order to form a portion of second coils 801, 802 (see FIG. 5) described later, the conductive path 524 and the conductive path 527 are electrically connected via the coil 701, and the conductive path 524 and the conductive path 528 are electrically connected via the coil 702.

Figure 5:
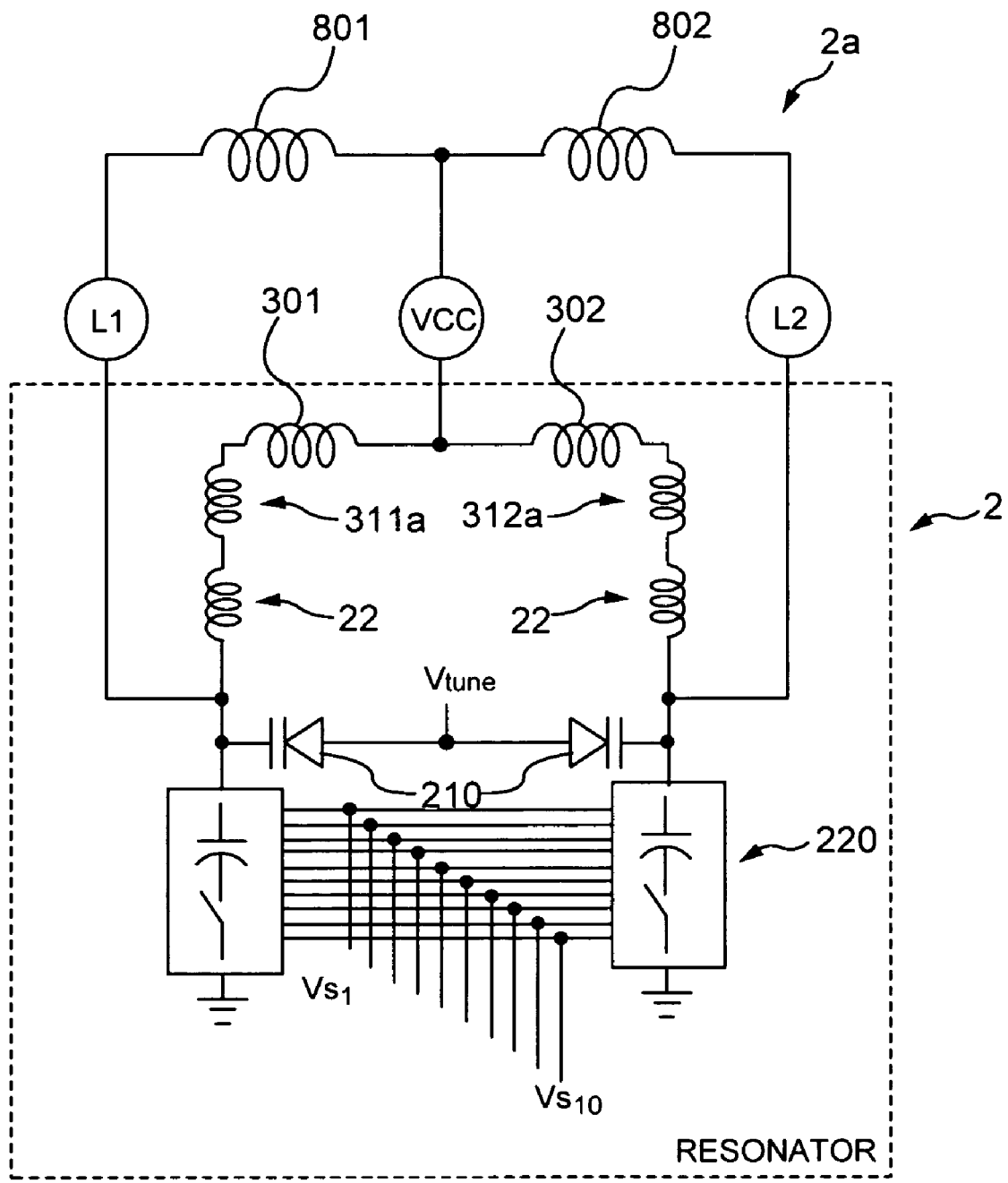
FIG. 5 is a circuit diagram showing an example of an equivalent circuit for a resonator in the circuit apparatus of the implementation.

Comparing the above configuration with an equivalent circuit illustrated in FIG. 5, it is understood that the second coil 801 corresponds to a portion of FIG. 4 from the coil terminal 127b to the opening electrode 124b via the metal thin line 1271, the adjustment terminal L1, the solder ball 67, the conductive path 527, the coil 701, the conductive path 524, the solder ball 64 and the external terminal VCC. Similarly, the second coil 802 corresponds to a portion of FIG. 4 from the coil terminal 128b to the opening electrode 124b via the metal thin line 1281, the adjustment terminal L2, the solder ball 68, the conductive path 528, the coil 702, the conductive path 524, the solder ball 64 and the external terminal VCC.

According to such a configuration, by adjusting, for example, own inductance of the coils 701, 702, that is, the length, diameter, number of wire turns, material, etc. on the user side of the semiconductor apparatus 1, the inductance of each of the second coils 801, 802 can be adjusted. In this way, overall inductance of the semiconductor apparatus 1 can be adjusted in the circuit apparatus 100 on the user side.

If the above-described semiconductor apparatus 1 is a tuner apparatus with a portion of the IC chip 20 and the coils 301, 302 equivalent to a resonator in a local oscillator circuit, the inductance of the single semiconductor apparatus 1 is set by, for example, the manufacturer to a predetermined value such that a Q value is maximized. If this semiconductor apparatus 1 is mounted onto an electronic device, etc. by the user, due to the mutual inductance coupling with surrounding circuit elements, etc., the inductance of the semiconductor apparatus 1 may be shifted from the predetermined value set by the manufacturer at the time of shipping. With interference of inductive noise from surrounding circuit elements, etc. at the time of the operation of the electronic device, etc., the inductance may shift from the predetermined value at the time of shipping. Contrary to this, according to the semiconductor apparatus 1 of the implementation, by measuring the inductance appropriately at the time of the mounting or at the time of the operation and by adjusting the own inductance of the coil 701, 702 described above, the shifting can be easily eliminated. Therefore, a semiconductor apparatus 1 is provided which can set and maintain the inductance to a predetermined value when mounted.

If the inductance is not shifted from the predetermined value when the above-described semiconductor apparatus 1 is mounted to the printed wiring substrate 500, the connection for the inductance adjustment illustrated in FIGS. 4A and 4B is not necessary. In this case, the coil electrodes 217b, 128b exposed on the underside of the semiconductor apparatus 1 have smaller exposed area as open ends of the circuit, as compared to the case that the coil electrodes 127b, 128b and the adjustment terminals L1, L2 are preliminary patterned to be electrically connected. Therefore, it is effective that the semiconductor apparatus 1 of the implementation is hardly affected by the inductive noise, etc. even at the time of the operation.

By the way, in the inductance adjustment described above, although two (2) second coils 801, 802 are used for two (2) coils 301, 302, respectively, the present invention is not limited to this.

Figure 6A:
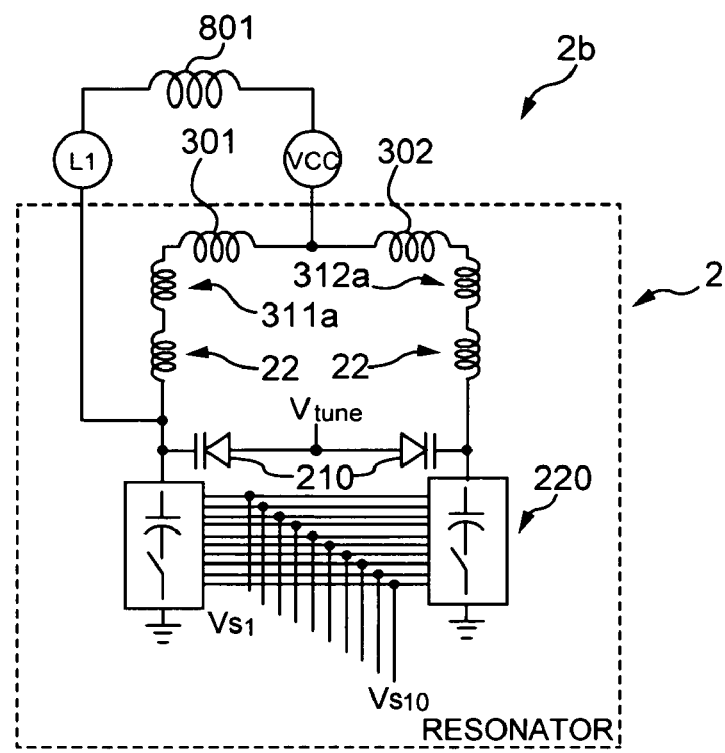
FIG. 6 is another circuit diagram showing an example of an equivalent circuit for a resonator in the circuit apparatus of the implementation.
Figure 6B:
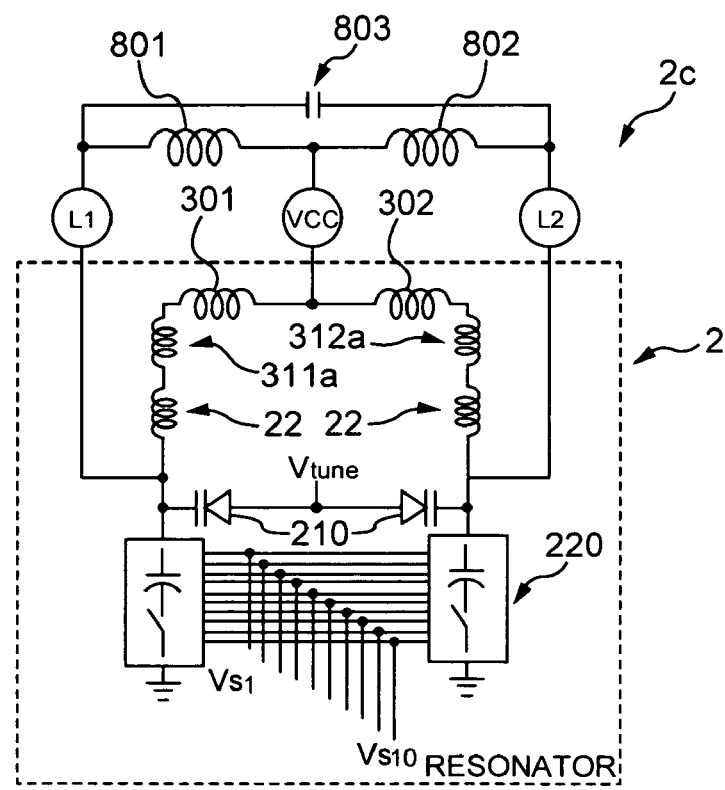

As illustrated in a circuit diagram of FIG. 6A, for example, an equivalent circuit 2b may be formed such that only one (1) coil 301 is adjusted. In this case, at least the wire bonding by the metal thin line 1281 of FIG. 4 is not performed. As illustrated in a circuit diagram of FIG. 6B, an equivalent circuit 2c may be formed by adding a capacitor (capacitance) 803 to the equivalent circuit 2a (FIG. 5).

-Stabilization of Inductance Characteristic-

In the implementation, a conductor such as the conductive path does not exist on the surface of the printed wiring substrate 500 confronting the coil 30 of the semiconductor apparatus 1. On the other hand, in the implementation, the dummy pattern 40 exists between the IC chip 20 and the coil 30. Since the inductive noise, etc. at the time of the operation of the IC chip 20 are blocked with this dummy pattern 40, the inductance characteristic of the coil 30 may be stabilized. The stabilization of the inductance characteristic means that the inductance of the coil 30 is maintained at a predetermined value or that the inductance of the coil 30 is maintained within a predetermined range, for example. Therefore, for a single semiconductor apparatus 1, if an error is generated in the mounting position, etc. of the IC chip 20 relative to the substrate 10 in the manufacturer of the semiconductor apparatus 1, the inductance characteristic and the stability thereof of the coil 30 are less affected by the operation of the IC chip 20. Since the conductor does not exist on the printed wiring substrate 500 near the coil 30, the mutual inductance coupling with the coil 30 may be formed mainly by the dummy pattern 40. Therefore, if the dummy pattern 40 is preliminary designed by the manufacture such that the coil 30 of the single semiconductor apparatus 1 has a predetermined inductance characteristic, the predetermined inductance characteristic of the coil 30 is maintained as long as the mounting is performed by the user of the semiconductor apparatus 1 on a region of the printed wiring substrate 500 where the conductor does not exist.

-Rolled Conductive Foil-

The coils 301, 302 affixed to the insulating substrate 11 in the semiconductor apparatus 1 of the implementation are made of rolled conductive foil. The main material of the rolled conductive foil is, for example, copper (Cu), and the rolled conductive foil is formed into a foil form by repeating the rolling and annealing processing of electrolytic copper which has been cast into an ingot form. This rolled copper foil is fixed to the under side of the insulating substrate 11 and the spiral patterns of the coils 301, 302 are formed appropriately. Not only the coils 301, 302, the entire conductive paths 12a, 12b may be made of this rolled copper foil.

Figure 7A:
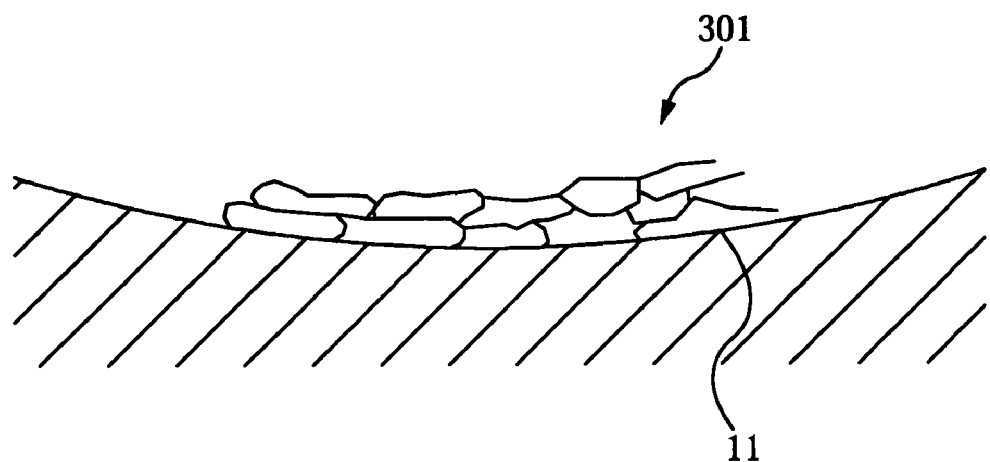
FIG. 7A is a sectional view enlarging a cross section of a coil composed of rolled copper foil affixed to an insulating substrate.

As illustrated in a sectional view of FIG. 7A, in the coil 301 made of the rolled copper foil, the crystals are spread in the direction along the under-side surface of the insulating substrate 11 to be laminated. On the other hand, as illustrated in a sectional view of FIG. 7B, if plaiting is performed, in such a coil 301', the crystals are arranged perpendicularly to the under-side surface of the insulating substrate 11. FIG. 7A is an enlarged sectional view of the cross section of the coil 301 (made of the rolled copper foil) of the implementation affixed to the under-side surface of the insulating substrate 11 and FIG. 7B is an enlarged sectional view of the cross section of the coil 301' formed by plating to the under-side surface of the insulating substrate 11.

Figure 7B:
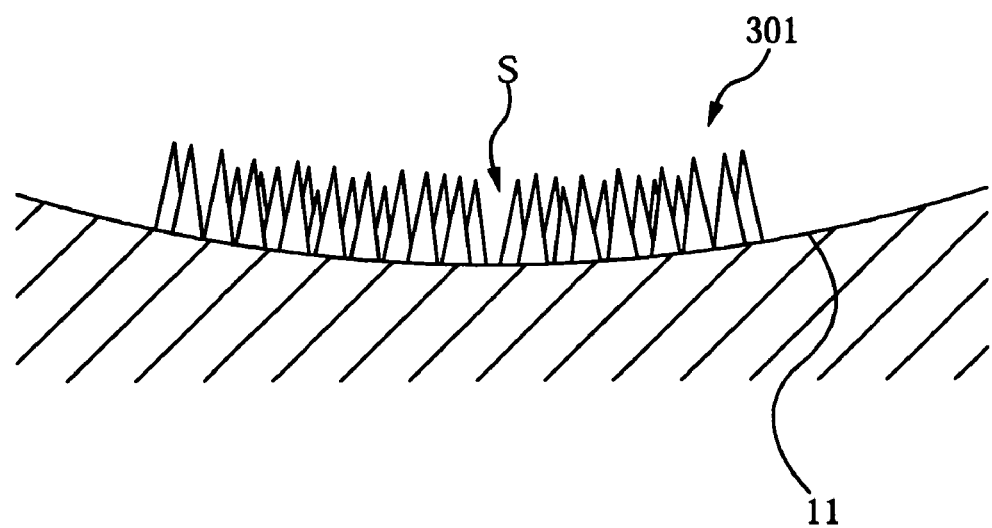
FIG. 7B is a sectional view enlarging a cross section of a coil formed by plating an insulating substrate.

For the coil 301 made of the rolled copper foil illustrated in FIG. 7A, the crystal grain boundary area is smaller than the crystal grain boundary area of the coil 301' formed by plating illustrated in FIG. 7B and, therefore, in this implementation, diffusion and permeation phenomena of impurities from the outside via the crystal grain boundaries are constrained. Therefore, as compared to the coil formed by plating, since a better purity of the coil 301 of the implementation is maintained and resistance is controlled to a lower level as a result, the inductance of the semiconductor apparatus 1 is easily maintained at a predetermined value.

As illustrated in FIG. 7A, if stress is generated due to the difference between the coefficients of thermal expansion of the coil 301 and the insulating substrate 11 and if the coil 301 and the insulating substrate 11 are bent as a result, in the coil 301 made of the rolled copper foil, the crystals are disposed such that the fracture is difficult to occur. In the coil 301 made of the rolled copper foil, the fracture is also difficult to occur due to tensile stress and bending stress acting on the insulating substrate 11 when the semiconductor apparatus 1 is mounted to the printed wiring substrate 500. On the other hand, as illustrated in FIG. 7b, in the coil 301' formed by plating, a crack S is easily generated between crystals. Therefore, as compared to the coil formed by plating, since the coil 301 of the implementation has a higher strength and resistance can be controlled to a lower level as a result, the inductance of the semiconductor apparatus 1 is easily maintained at a predetermined value.

From the description above, in the semiconductor apparatus 1 of the implementation, the inductance can be set to a predetermined value at the time of the mounting and the stability of the inductance characteristic is maintained at the time of the operation. In this way, a better frequency characteristic such as a Q value is obtained from the semiconductor apparatus 1 and, therefore, better performance is obtained from the electronic device equipped with the semiconductor apparatus 1.

The semiconductor apparatus 1 of the implementation has the IC chip 20, the first coils 301, 302, 311a, 312a, 22 electrically connected to the IC chip 20 and the coil electrodes 127b, 128b electrically connected to the first coils 301, 302, 311a, 312a, 22, is comprised of the adjustment terminals L1, L2 which can be electrically connected to the coil electrodes 127b, 128b as well as which can be electrically connected to the second coils 801, 802 on the outside of the semiconductor apparatus 1, and is characterized by obtaining the inductance composed of the first coils 301, 302, 311a, 312a, 22 and the second coils 801, 802 by electrically connecting the adjustment terminals L1, L2 to the coil electrodes 127b, 128b and the second coils 801, 802. According to the semiconductor apparatus 1, by measuring the inductance appropriately at the time of the mounting or at the time of the operation and by adjusting the own inductance of, for example, the coil 701, 702 which are a portion of the second coils 801, 802, for example, the shift from the inductance set as a single apparatus can be easily eliminated. Therefore, a semiconductor apparatus 1 is provided which can set and maintain the inductance to a predetermined value when mounted.

The semiconductor apparatus 1 of the implementation is comprised of: the substrate 10; the IC chip 20 provided on the upper side of the substrate, the coils 301, 302 formed in a spiral shape on the under side of the substrate 10 as well as electrically connected to the IC chip 20; the coil electrodes 127b, 128b formed on the under side of the substrate 10 as well as electrically connected to the coils 301, 302; and the adjustment terminals L1, L2 formed on the under side of the substrate 10 which can be electrically connected to the coil electrodes 127b, 128b as well as which can be electrically connected to the second coils 801, 802 on the outside of the semiconductor apparatus 1, and is characterized by obtaining the inductance composed of the coils 301, 302 and the second coils 801, 802 by electrically connecting the adjustment terminals L1, L2 to the coil electrodes 127b, 128b and the second coils 801, 802. According to the semiconductor apparatus 1, the inductance can be set and maintained to a predetermined value when mounted.

Preferably, the semiconductor apparatus 1 described above is further comprised of the dummy pattern 40 formed on the surface confronting the IC chip 20 on the upper side of the substrate 10 for stabilizing the inductance characteristic of the coils 301, 302. For a single semiconductor apparatus 1, if an error is generated in the mounting position, etc. of the IC chip 20 relative to the substrate 10 in the manufacturer of the semiconductor apparatus 1, the inductance characteristic and the stability thereof of the coil 30 are less affected by the operation of the IC chip 20. If the dummy pattern 40 is preliminary designed by the manufacture such that the coil 30 of the single semiconductor apparatus 1 has a predetermined inductance characteristic, the predetermined inductance characteristic of the coil 30 is maintained as long as the mounting is performed by the user of the semiconductor apparatus 1 on a region of the printed wiring substrate 500 where the conductor does not exist.

In the semiconductor apparatus 1 described above, preferably, the IC chip 20 is fixed to the dummy pattern 40 via the insulating paste 21. In this way, since the IC chip 20 can be fixed in the vicinity of the dummy pattern 40, the inductive noise, etc. at the time of the operation of the IC chip 20 can be blocked more effectively.

In the semiconductor apparatus 1 described above, preferably, the dummy pattern 40 is constituted by arranging a plurality of the isolated conductors 401 in a predetermined shape spaced by the predetermined gaps 402. In this way, when the semiconductor apparatus 1 is mounted onto, for example, the printed wiring substrate 500, this leads to alleviation of stress acting on the semiconductor apparatus 1 and the stability of the inductance characteristic is enhanced.

In the semiconductor apparatus 1 described above, preferably, the dummy pattern 40 is constituted by arranging a plurality of the isolated conductors 401 in an approximate rectangular shape such that a plurality of the predetermined gaps 402 is arranged approximately linearly to be crossed. In this way, since the predetermined gaps 402 may form, for example, a concave shape relative to the conductor 401, the insulating paste 21 can be easily applied.

In the semiconductor apparatus 1 described above, preferably, the IC chip 20 is a rectangular and the plurality of the predetermined gaps 402 arranged approximately linearly to be crossed is provided to have a predetermined angle relative to the external edge of the IC chip 20. In this way, since the predetermined gaps 402 may have a radial shape from the center of the substrate 10, the fugitivity of voids is increased at the time of the application of the isolating paste 21.

Preferably, the semiconductor apparatus 1 described above is further comprised of: a through-hole penetrating between the upper side and under side of the substrate 10 and electrically connecting the IC chip 20 and the electrodes 124b, 127b, 128b, 301b, 302b of the coils; and the mold resin 50 sealing the upper side of the substrate 10. In such a semiconductor apparatus 1, the inductance can be set and maintained to a predetermined value when mounted.

In the semiconductor apparatus 1 described above, the coils 301, 302 are the rolled conductive foil fixed to the under side of the substrate 10. Since the crystal grain boundary area of the coils 301, 302 made of the rolled conductive foil is smaller than the crystal grain boundary area in the case of being formed by plating, diffusion and permeation phenomena of impurities from the outside via the crystal grain boundaries are constrained. Therefore, a better purity of the coils 301, 302 is maintained and resistance is controlled to a lower level. If stress is generated due to the difference between the coefficients of thermal expansion of the coils 301, 302 and the insulating substrate 11 and if the bending occurs, in the coils 301, 302 made of the rolled copper foil, the crystals are disposed such that the fracture is more difficult to occur as compared to the case of being formed by plating. In the coil 301 made of the rolled copper foil, the fracture is also difficult to occur due to tensile stress and bending stress acting on the insulating substrate 11 when the semiconductor apparatus 1 is mounted to the printed wiring substrate 500. Therefore, the coils 301, 302 have a higher strength and resistance can be controlled to a lower level. Consequently, the inductance of the semiconductor apparatus 1 is easily maintained at a predetermined value.

Case that Coil Exists on Upper Side of Substrate and that Conductive Pattern Exists on Under Side In the semiconductor apparatus 1 of the implementation described above, although the conductive pattern (dummy pattern 40) is formed on the upper side which is the IC chip side of the substrate (substrate 10) and the coil (coil 30) is formed on the under side of the substrate 10, this relative positioning relationship between the conductive pattern and the coil on the upper and under sides of the substrate may be reversed.

As shown in FIGS. 8A to 8C, in a semiconductor apparatus 1", a coil 30" is formed on the upper side of the substrate 10" and a dummy pattern 40" is formed on the under side of the substrate 10". FIG. 8A is a plan view of the upper side of the semiconductor apparatus 1"; FIG. 8B is a side view of the semiconductor apparatus 1"; and FIG. 8C is a perspective view of the under side of the semiconductor apparatus 1" seen from the upper side. Hereinafter, in this semiconductor apparatus 1", the IC chip side (+Z side) is referred to as the "upper side" and, in this semiconductor apparatus 1, the side opposite to the IC chip side is referred to as the "under side".

The semiconductor apparatus 1" in the implementation is a package having an appearance configuration approximately equivalent to the semiconductor apparatus 1 illustrated in FIGS. 1A to 1C except the relative positioning relationship described above. The semiconductor apparatus 1" is constituted by mainly comprising a substrate 10", an IC chip (semiconductor chip) 20", a coil 30", a dummy pattern (conductive pattern) 40, a coil electrodes (first electrodes) 127b", 128b" and an adjustment terminals (second electrodes) L1, L2. The semiconductor apparatus 1" is not limited to such a configuration and may not be comprised of the dummy pattern 40.

As illustrated in FIG. 8B, with regard to the substrate 10", the main material is an insulating substrate 11" made of, for example, glass epoxy, and a predetermined conductive path 12a" is affixed to the upper side thereof, which is coated thereon with an insulating solder resist pattern 13a". To the under side of the insulating substrate 11", a predetermined conductive path 12b" is affixed, which is coated thereon with an insulating solder resist pattern 13b". Through-holes are bored in the insulating substrate 11", penetrating between the upper side and under side.

As illustrated in FIG. 8A, the predetermined conductive path 12a" affixed to the upper side is constituted by comprising 26 IC chip patterns and through-hole opening electrodes 301a", 302a", 304a" for a bridge line path 303b" (FIG. 8C) described later. Each IC chip pattern is constituted by opening electrodes (e.g., opening electrodes 121a", 124a"), wiring (e.g., wiring 122a", 125a"), and internal electrodes (e.g., internal electrode 123a", 126a"). Particularly, each IC chip pattern connected to the coils 301", 302" has opening electrodes 127a", 128a", respectively, on the wiring connecting the coils 301", 302" and internal electrodes. The opening electrodes 127a", 128a" are connected via the through-hole to adjustment terminals L1, L2 (FIG. 8C) described later on the under side. In the illustration of FIG. 8A, the IC chip pattern connected to an external terminal VCC (FIG. 8C) via the through-hole is also comprised of a line path 305a" extending along the Y axis direction on the upper side to the opening electrode 304a".

As illustrated in FIG. 8C, the predetermined conductive path 12b" affixed to the under side is constituted by comprising patterns corresponding to the above-described 26 IC chip patterns and the bridge line path 303b". Each IC chip pattern is constituted by opening electrodes (e.g., opening electrodes 121b", 124b"), wiring (e.g., wiring 122b", 125b"), and external terminals (electrodes, e.g., external terminals 123b", 126b"). The above-described through-hole opening electrode 121a" on the upper side and the opening electrode 121b" on the under side are oppositely arranged on each side.

The bridge line path 303b" is for the purpose of connecting two (2) coils 301", 302". The bridge line path 303b" is connected to the external terminal VCC to have the same electric potential, via the through-hole connecting the opening electrode 304b" located at the center in the X axis direction and the opening electrode 304a" (FIG. 8A), the line path 305a" (FIG. 8A) and the through-hole in the IC chip pattern (FIG. 8A) described above. The bridge line path 303b" is electrically connected to the electrodes (e.g., electrodes 201", 202") of the IC chip 20", via the above-described IC chip pattern and a metal thin line 22" (FIG. 8A).

The IC chip 20" (FIGS. 8A and 8B) is a bear chip which is the same as the IC chip 20 illustrated in FIGS. 1A to 1C.

As illustrated in FIG. 8A, the coil 30" is composed of two (2) flat coils 301", 302" in a spiral shape affixed to the insulating substrate 10", as a portion of the upper-side conductive path 12a" described above. As illustrated in FIG. 8B, the coils 301", 302" of the implementation are affixed to the upper side of the insulating substrate 10" and is coated with the solder resist pattern 13a". To this solder resist pattern 13a", the IC chip 20" is fixed via an insulating paste (insulating adhesive) 21". According to the illustration of FIG. 8A, two (2) coils 301", 302" are in a same shape swirling in anticlockwise rotation from the center toward the outside on the surface of the substrate 10".

As illustrated in FIG. 8C, the dummy pattern 40" is formed on the under side of the insulating substrate 10" oppositely to the coils 301", 302" on the upper side of the insulating substrate 10". Specifically, the dummy pattern 40" of the implementation is constituted by a single conductor made mainly of, for example, copper (Cu) in an approximate rectangular shape surrounding the above-described bridge line path 303b" in the center portion thereof. In this way, since the conductor exists around the bridge line path 303b", the bridge line path 303b" acts as a so-called coplanar line path. Therefore, if an electromagnetic field is generated from the bridge line path 303b", the electromagnetic field is absorbed by the dummy pattern 40".

A contour of the dummy pattern 40" of the implementation is aligned to a contour of an approximate rectangular combining two (2) coils 301", 302". In other words, this dummy pattern 40" has an outer edge at the same position as or a position beyond an outer rim of the case that two (2) coils 301", 302" are considered as the integral coil 30". In this way, if an electromagnetic field is generated from the coil 30" to the under side (−Z side) when the coil 30" is operated, the electromagnetic field is absorbed by the dummy pattern 40".

The dummy pattern 40" is connected to a plurality of grounding terminals 15" described later to be the same electric potential.

As illustrated in FIG. 8C, the plurality of the grounding terminals (electrodes) 15" are affixed to the insulating substrate 10" for grounding when mounted on, for example, the printed wiring substrate 500 (FIG. 4B), along with the 26 external terminals described above, as a portion of the under-side conductive path 12b" described above. However, the grounding terminals 15" are not limited for the purpose of grounding and may be any electrodes for maintaining the dummy pattern 40" to the same voltage. A voltage value of the same voltage is determined depending on a voltage in a predetermined site of the printed wiring substrate 500, for example. In this way, by maintaining the dummy pattern 40" in the mutual inductance coupling with the coil 30" to the same voltage to stabilize the electric potential thereof, the inductance characteristic of the coil 30" is more stabilized. The stabilization of the inductance characteristic of the coil 30" means that the inductance of the coil 30" is maintained at a predetermined value or that the inductance of the coil 30" is maintained within a predetermined range, for example.

As illustrated in FIG. 8C, the coil electrodes 127b", 128b" correspond to the upper-side opening electrodes 127a", 128a", as a portion of the under-side conductive path 12b" described above. The coil electrodes 127b", 128b" are connected to the upper-side opening electrodes 127a", 128a", respectively, via the through-holes.

As illustrated in FIG. 8C, the adjustment terminals L1, L2 are formed to make a pair with the coil electrodes 127b", 128b", respectively, as a portion of the under-side conductive path 12b" described above. The "adjustment" of the adjustment terminals L1, L2 means overall inductance of the semiconductor apparatus 1" in a circuit apparatus 100 (e.g., circuit apparatus 100 of FIG. 4) on the user side described above. Although the coil electrodes 127b", 128b" and the adjustment terminals L1, L2 are in the vicinity while being spaced and insulated from each other, the present invention is not limited to this and, for example, the coil electrodes 127b", 128b" and the adjustment terminals L1, L2 may not be in the vicinity. In fact, as described above, the coil electrodes 127b", 128b" and the adjustment terminals L1, L2 may have a mutual space distance longer or shorter than the illustration of FIG. 8C as long as the electric connection can be achieved by wire-bonding, etc. on the user side, and another conductive path, etc. may exist in a space therebetween.

In the implementation, the entire surface of the under side of the substrate 10" is coated: with the solder resist pattern 13b" described above, except the pluralities of the external terminals, the coil electrodes 127b", 128b" and the adjustment terminals L1, L2 described above.

In the implementation, after the IC chip 20" is mounted on the substrate 10" with the coil 30" formed, the upper side of the substrate 10" is sealed with mold resin (insulating resin) 50".

In the semiconductor apparatus 1 of the implementation, since the input from the outside to the coils 301", 302" only exits as the input via the external terminal VCC, when the semiconductor apparatus 1" is incorporated into a portable electronic device, etc. and is operated, in principle, only the external terminal VCC will be an electric connection destination from, for example, a printed wiring substrate to the coils 301", 302". However, if the semiconductor apparatus 1" is electrically connected to the printed wiring substrate also via other external terminals (e.g., external terminal 123b"), the inductance may be shifted from inductance (i.e., inductance set by the manufacturer of the semiconductor apparatus 1") of only the inductors (e.g., the inductors 311a, 312a of FIG. 2), the metal thin lines 22", etc. (which are the first coil) originated from the package. Therefore, as is the case with the semiconductor apparatus illustrated in FIGS. 1A to 1C, in the semiconductor apparatus 1", the inductance can be adjusted by externally connecting second coils (e.g., the second coils 801, 802 of FIG. 5) in parallel with the first coils on the user side. Specifically, as is the case with the semiconductor apparatus illustrated in FIGS. 1A to 1C, for example, the coil electrode 127b" and the adjustment terminal L1 are wire-bonded through a metal thin line (e.g., the metal thin line 1271 of FIGS. 4A and 4B) and the coil electrode 128b" and the adjustment terminal L2 are wire-bonded through a metal thin line (e.g., the metal thin line 1281 of FIGS. 4A and 4B). By electrically connecting the coil electrode 127b", 128b" and the adjustment terminal L1, L2, respectively, overall inductance of the semiconductor apparatus 1" can be adjusted in the electric device on the user side.

As is the case with the semiconductor apparatus 1 illustrated in FIGS. 1A to 1C, the semiconductor apparatus 1" of the implementation may be a tuner apparatus with a portion of the IC chip 20" and the coils 301", 302" equivalent to a resonator in a local oscillator circuit. In this case, the inductance of the single semiconductor apparatus 1" is set by, for example, the manufacturer to a predetermined value such that a Q value is maximized. If this semiconductor apparatus 1" is mounted onto an electronic device, etc. by the user, due to the mutual inductance coupling with surrounding circuit elements, etc., the inductance of the semiconductor apparatus 1" may be shifted from the predetermined value set by the manufacturer at the time of shipping. With interference of inductive noise from surrounding circuit elements, etc. at the time of the operation of the electronic device, etc., the inductance may shift from the predetermined value at the time of shipping.

For such "shifting", according to the semiconductor apparatus 1" of the implementation, by measuring the inductance appropriately at the time of the mounting or at the time of the operation and by adjusting the inductance of the second coil 801, 802 (FIG. 5), the shifting can be easily eliminated. Therefore, a semiconductor apparatus 1" is provided which can set and maintain the inductance to a predetermined value when mounted.

According to the semiconductor apparatus 1", if an electromagnetic field is generated from the coil 30", the bridge line path 303b", etc., the electromagnetic field is absorbed by the dummy pattern 40" and, therefore, the electromagnetic interference to the electronic device, etc. equipped with the semiconductor apparatus 1" can be constrained. Consequently, better performance is obtained from the electronic device, etc.

-Two Line-Symmetry Coils-

In the semiconductor apparatus 1" of the implementation described above (FIG. 8A), although two (2) coils 301", 302" are formed in the same shape swirling in anticlockwise rotation from the center toward the outside on the surface of the substrate 10", the present invention is not limited to this.

Figure 9:
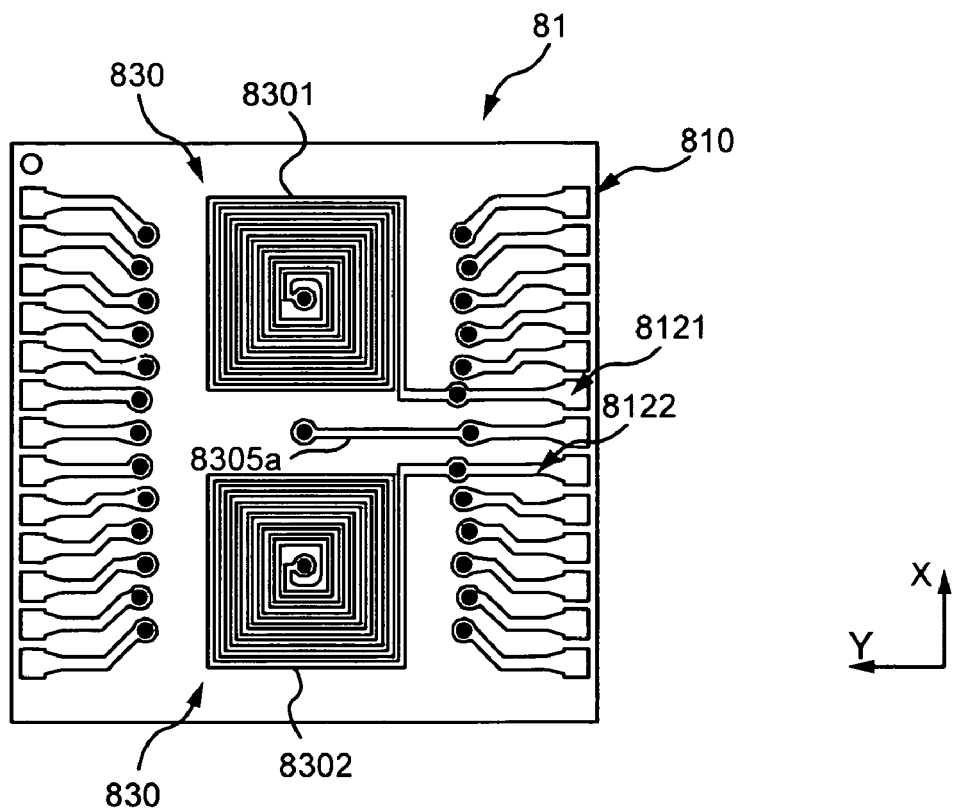
FIG. 9 is a plan view of the upper side of the substrate of the implementation.

For example, as shown in FIG. 9, two (2) coils 8301, 8302 of a semiconductor apparatus 81 may be formed to be line-symmetry shapes relative to a boundary along the Y axis. The figure is a plan view of the upper side of a substrate 810. In the illustration in the figure, the shapes of two (2) coils 8301, 8302 are in a relationship of a mirror image to each other, relative to a boundary dividing a surface of the upper side of the substrate 810 confronting the IC chip (e.g., IC chip 20" of FIG. 8A) in two, for example, a boundary passing through the middle point in the X axis direction and parallel to the Y axis. A line path 8305*a* corresponding to the above-described line path 305*a"* (FIG. 8*a*) is located on this boundary.

As described above, two (2) coils (third coil and fourth coil) 8301, 8302 are connected to the IC chip via two (2) IC chip patterns 8121, 8122 and two (2) metal thin lines (e.g., metal thin line 22" of FIG. 8B), respectively. Therefore, when two (2) coils 8301, 8302 are line symmetry relative to the boundary described above, if two (2) IC chip patterns 8121, 8122 and two (2) metal thin lines are respectively formed to have the same configuration, inductance values of two (2) coils 8301, 8302 including wiring can be made equal. In this way, since the package of the semiconductor apparatus 81 is easily designed and the configuration of the coil 830 including wiring is simplified, the manufacturing cost of the semiconductor apparatus 81 is reduced as a result.

-Auxiliary Conductive Pattern-

In the semiconductor apparatus 1" of the implementation described above (FIG. 8B), although the dummy pattern 40" is formed only on the under side of the substrate 10", the present invention is not limited to this. In the semiconductor apparatus 1" of the implementation described above, the IC chip 20" is provided via the solder resist pattern 13*a"* and the insulating paste 21" on the upper side of the insulating substrate 10" to which two coils 301", 302" are affixed. For example, an auxiliary conductive pattern having approximately the same shape as the dummy pattern 40" may exist between the solder resist pattern 13*a"* and the insulating paste 21".

Figure 10:
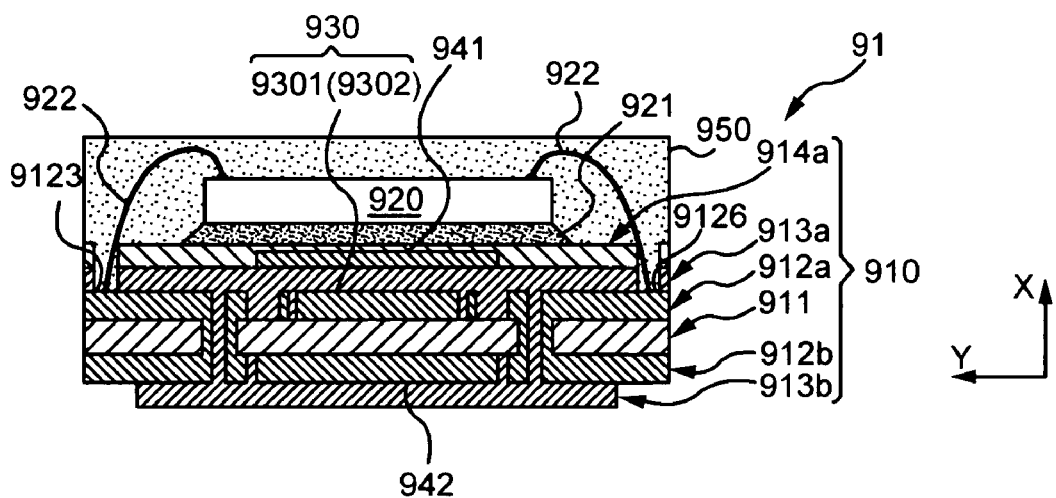
FIG. 10 is yet another side view of the semiconductor apparatus of the implementation.

As illustrated in FIG. 10, for a substrate 910 of a semiconductor apparatus 91, the main material is an insulating substrate 911 made of, for example, glass epoxy, and to the upper side thereof: (1) a predetermined conductive path 912*a* (including coils 9301, 9302) is affixed; (2) an insulating solder resist pattern 913*a* coats thereon; (3) a dummy pattern (auxiliary conductive pattern) 941 is affixed thereon which has an approximate rectangular shape and which is constituted by a single conductor; and (4) an insulating solder resist pattern 914*a* coats thereon. To the under side of the insulating substrate 911: (5) a predetermined conductive pattern 912*b* and a dummy pattern (conductive pattern) 942 are affixed; and (6) an insulating solder resist pattern 913*b* coats thereon. FIG. 10 is a side view of the semiconductor apparatus 91.

In the semiconductor apparatus 91, in addition to the dummy pattern 942 provided on the under side of the substrate 910, another dummy pattern 941 exists between the IC chip 920 and the solder resist pattern (which can be considered as the insulating adhesive) 913*a*.

Since the inductive noise, etc. at the time of the operation of the IC chip 920 are blocked with this dummy pattern 941, the inductance characteristic of the coil 930 (coils 9301, 9302) may be stabilized. Therefore, for a single semiconductor apparatus 91, for example, on the manufacturer side, if an error is generated in the mounting position, etc. of the IC chip 920 relative to the substrate 910 of the semiconductor apparatus 91, the inductance characteristic and the stability thereof of the coil 930 are less affected by the operation of the IC chip 920.

-Rolled Conductive Foil-

As is the case of the semiconductor apparatus 1 illustrated in FIG. 1, the coils 30", 830, 930 affixed to the upper side of the insulating substrate 11", 911 in the semiconductor apparatus 1", 81, 91 of the implementation are made of rolled conductive foil. This rolled copper foil is fixed to the under side of the insulating substrate 11", 911 and the spiral patterns of the coils 30", 830, 930 are formed appropriately. Not only the coils 30", 830, 930, the entire conductive paths 12*a"*, 12*b"*, 912*a*, 912*b* may be made of this rolled copper foil.

As described above, for example, as compared to the coil formed by plating, since a better purity of the coils 30", 830, 930 of the implementation is maintained and resistance is controlled to a lower level as a result, the inductance of the semiconductor apparatus 1", 81, 91 is easily maintained at a predetermined value. As described above, for example, as compared to the coil formed by plating, since the coils 30", 830, 930 of the implementation have a higher strength and resistance can be controlled to a lower level as a result, the inductance of the semiconductor apparatus 1", 81, 91 is easily maintained at a predetermined value.

-Radio Receiver-

Figure 11:
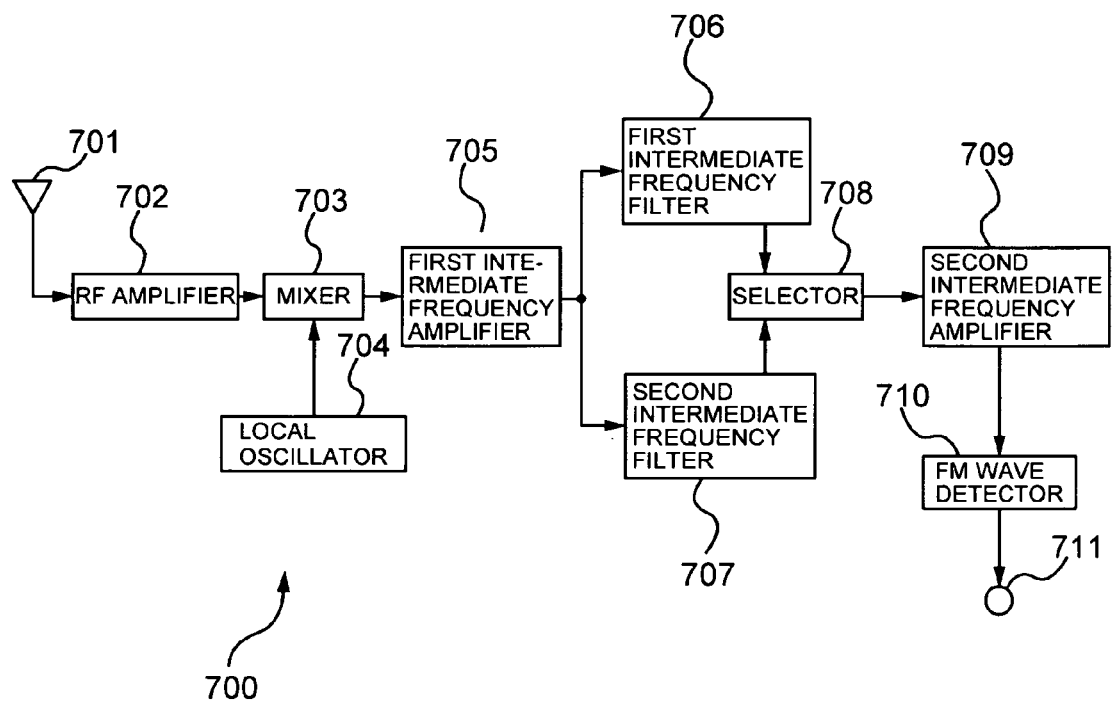
FIG. 11 is a block diagram showing a configuration example of an FM radio receiver of the implementation.

The semiconductor apparatuses 1, 1", 81, 91 described above are mounted as tuner apparatuses on the printed wiring substrate 500 (FIG. 4B) along with other semiconductor apparatuses to constitute a portable FM radio receiver 700 (FIG. 11), for example. FIG. 11 is a block diagram showing a configuration example of the FM radio receiver 700.

As described in FIG. 11, the FM radio receiver 700 of the implementation is constituted by comprising an antenna 701, an RF amplifier 702, a mixer 703, a local oscillator 704, a first intermediate frequency amplifier 705, a first intermediate frequency filter 706, a second intermediate frequency filter 707, a selector 708, a second intermediate frequency amplifier 709, an FM wave detector 710 and an output terminal 711.

A broadcast station signal received by the antenna 701 is amplified by the RF amplifier 702 and mixed by the mixer 703 with a local oscillator signal from the local oscillator 704 to be converted to an intermediate frequency signal. The intermediate frequency signal is amplified by the first intermediate frequency amplifier 705 and is band-limited by the first intermediate frequency filter 706 or second intermediate frequency filter 707 and the selector 708. The band-limited intermediate frequency signal is amplified or amplitude-limited by the second intermediate frequency amplifier 709 and is FM-modulated by the FM wave detector 710 to be output to the output terminal 711.

In the semiconductor apparatus 1, 1", 81, 91 as the tuner apparatus of the implementation, the external terminal (e.g., VCC) on the under side thereof is electrically connected via, for example, the solder ball 68 to the conductive paths 527, 528 on the printed wiring substrate 500 (FIG. 4B) to constitute the local oscillator 704 described above. As described above, since a better frequency characteristic such as a Q value is obtained from the tuner apparatus, better performance is obtained from the FM radio receiver 700 of the implementation.

The circuit apparatus comprising the semiconductor apparatus 1, 1", 81, 91 of the implementation is not limited to the FM radio receiver 700. The circuit apparatus may be a portable receiver where the coil 30, 30", 830, 930 acts as an antenna for receiving, for example, radio signals, that is, a cellular phone, etc., for example.

-Possibility of Setup and Maintenance of Inductance at the Time of Mounting-

The semiconductor apparatus 1" of the implementation is comprised of: the substrate 10"; the IC chip 20" provided on the upper side of the substrate 10"; the spiral-shape coil 30" formed on the surface of the upper side of the substrate 10"

confronting the IC chip 20" and electrically connected to the IC chip 20"; the coil electrodes 127b", 128b" formed on the under-side surface of the substrate 10" and electrically connected to the coil 30"; and the adjustment terminals L1, L2 formed on the under-side surface of the substrate 10" which can be electrically connected to the coil electrodes 127b", 128b" as well as which can be electrically connected to the second coils 801, 802 on the outside of the semiconductor apparatus 1", and is characterized by obtaining the inductance composed of the coil 30" and the second coils 801, 802 by electrically connecting the adjustment terminals L1, L2 to the coil electrodes 127b", 128b" and the second coils 801, 802. According to the semiconductor apparatus 1", by measuring the inductance appropriately at the time of the mounting or at the time of the operation and by adjusting the inductance of the second coil 801, 802, for example, the shift from the inductance set as a single apparatus can be easily eliminated. Therefore, a semiconductor apparatus 1" is provided which can set and maintain the inductance to a predetermined value when mounted.

Preferably, the semiconductor apparatus 1" described above is further comprised of the dummy pattern 40" formed on the surface opposite to the coil 30" on the under side of the substrate 10" for stabilizing the inductance characteristic of the coil 30". According to the semiconductor apparatus 1", if an electromagnetic field is generated from the coil 30", the electromagnetic field is absorbed by the dummy pattern 40" and, therefore, the electromagnetic interference can be constrained in the electronic device, etc. to which the semiconductor apparatus 1" is mounted.

In the semiconductor apparatus 1" described above, preferably, the IC chip 20" is fixed to the substrate 10" via the solder resist pattern 13a". In this way, since the IC chip 20" is electrically insulated from the conductive path 12a" which is a foundation of the solder resist pattern 13a", operations of the coil 30" and the IC chip 20" is stabilized.

In the semiconductor apparatus 1" described above, preferably, the semiconductor apparatus 1" is further comprised of a plurality of the grounding terminals 15" formed on a surface of the under side of the substrate 10" for maintaining the dummy pattern 40" to the same voltage. By maintaining the electric potential of the dummy pattern 40" in the mutual inductance coupling with the coli 30" in this way, the inductance characteristic of the coil 30" is more stabilized. A voltage value of the same voltage is determined depending on a voltage in a predetermined site of the printed wiring substrate 500 (FIG. 4B), for example.

In the semiconductor apparatus 1" described above, preferably, a plurality of the grounding terminals 15" is grounded. For example, if the predetermined site described above is grounded, the mounting operation of the semiconductor apparatus 1" will be easier, for example, on the user side.

In the semiconductor apparatus 81 described above, the coil 830 may be composed of the coil 8301 and coil 8302 and the coil 8301 and coil 8302 may have line-symmetry shapes relative to a boundary dividing a surface of the upper side of the substrate 810 confronting the IC chip (e.g., IC chip 20") in two. For example, two (2) coils 8301, 8302 are connected to the IC chip (e.g., IC chip 20") via two (2) IC chip patterns 8121, 8122 and two (2) metal thin lines (e.g., metal thin line 22"), respectively. Therefore, when two (2) coils 8301, 8302 are line symmetry relative to the boundary described above, if two (2) IC chip patterns 8121, 8122 and two (2) metal thin lines are respectively formed to have the same configuration, inductance values of two (2) coils 8301, 8302 including wiring can be made equal. In this way, since the package of the semiconductor apparatus 81 is easily designed and the configuration of the coil 830 including wiring is simplified, the manufacturing cost of the semiconductor apparatus 81 is reduced as a result.

The semiconductor apparatus 91 may be further comprised of the dummy pattern 941 existing between the IC chip 920 on the upper side of the substrate 910 and the solder resist pattern 913a for stabilizing an inductance characteristic of the coil 930. Since the inductive noise, etc. at the time of the operation of the IC chip 920 are blocked with this dummy pattern 941, the inductance characteristic of the coil 930 may be stabilized.

Preferably, the semiconductor apparatus 1", 81, 91 described above is further comprised of: a through-hole penetrating between the upper side and under side of the substrate 10", 810, 910 and electrically connecting the coil 30", 830, 930 and the coil electrodes 127b", 128b"; and the mold resin 50", 950 sealing the upper side of the substrate 10", 810, 910. In such a so-called package, by electrically connecting the coil electrode 127b", 128b" and the adjustment terminals L1, L2, respectively, on the underside thereof, the inductance can be set and maintained to a predetermined value when mounted.

In the semiconductor apparatus 1", 81, 91 described above, preferably, the coil 30" is the rolled conductive foil fixed to the upper-side surface of the substrate 10", 810, 910. In this way, for example, as compared to the coil formed by plating, since a better purity of the coils 30", 830, 930 is maintained and resistance is controlled to a lower level as a result, the inductance of the semiconductor apparatus 1", 81, 91 is easily maintained at a predetermined value. For example, as compared to the coil formed by plating, since the coils 30", 830, 930 of the implementation have a higher strength and resistance can be controlled to a lower level as a result, the inductance of the semiconductor apparatus 1", 81, 91 is easily maintained at a predetermined value.

-Other Implementations-

The above implementations of the present invention are for the purpose of facilitating the understanding of the present invention, rather than limiting the interpretation thereof. The present invention may variously be changed and altered without departing from its spirit and encompasses equivalents thereof.

While the semiconductor apparatus 1 has the substrate 10 (FIG. 1) in the above implementations, the present invention is not intended to be limited thereto. For example, the semiconductor apparatus 1 may not have the substrate 10 and the conductive paths 12a, 12b may be directly buried in the mold resin 50. In this case, the conductive path 12a and the conductive path 12b are provided together on the same surface of one side of the mold resin 50. Therefore, the IC chip 20 and the coils 301, 302 electrically connected respectively to the conductive paths 12a, 12b are sealed alongside of each other on one side of the mold resin 50.

While the coil electrodes 127b, 128b and the adjustment terminals L1, L2 are adjacent to, spaced apart from and insulated from each other in the above implementations, the present invention is not intended to be limited thereto, and, for example, the coil electrodes 127b, 128b and the adjustment terminals L1, L2 may not be in the vicinity. In fact, the coil electrodes 127b, 128b and the adjustment terminals L1, L2 may have a mutual space distance longer or shorter than the case of the implementations described above as long as the electric connection can be achieved by wire-bonding, etc. on the user side, and another conductive path, etc. may exist in a space therebetween.

While the coils 701, 702 (FIG. 4) are used as part of the second coils 801, 802 (FIG. 5) in the above implementations, the present invention is not intended to be limited thereto. For example, a coil pattern may be formed preliminary on the printed wiring substrate 500.

It is claimed:

1. A semiconductor apparatus comprising:
   a semiconductor chip;
   a first coil electrically connected to the semiconductor chip;
   a first electrode electrically connected to the first coil; and
   a second electrode electrically connectable to the first electrode, the second electrode electrically connectable to a second coil on the outside of the semiconductor apparatus,
   wherein the second electrode is electrically connected to the first electrode to obtain inductance composed of the first coil, and
   wherein the second electrode is electrically connected to the first electrode and the second coil to obtain inductance composed of the first coil and the second coil.

2. A semiconductor apparatus comprising:
   a substrate;
   a semiconductor chip disposed on one side of the substrate;
   a first coil formed in a spiral shape on the other side of the substrate and electrically connected to the semiconductor chip;
   a first electrode formed on the other side of the substrate and electrically connected to the first coil; and
   a second electrode formed on the other side of the substrate and electrically connectable to the first electrode, the second electrode electrically connectable to a second coil on the outside of the semiconductor apparatus,
   wherein the second electrode is electrically connected to the first electrode to obtain inductance composed of the first coil, and
   wherein the second electrode is electrically connected to the first electrode and the second coil to obtain inductance composed of the first coil and the second coil.

3. The semiconductor apparatus of claim 2, further comprising a conductive pattern formed on a surface facing to the semiconductor chip on the one side of the substrate for stabilizing an inductance characteristic of the first coil.

4. The semiconductor apparatus of claim 3, wherein the semiconductor chip is fixedly secured to the conductive pattern via an insulating adhesive.

5. The semiconductor apparatus of claim 3, wherein the conductive pattern includes a plurality of isolated conductive patterns in a predetermined shape spaced apart from one another by predetermined gaps.

6. The semiconductor apparatus of claim 5, wherein the conductive pattern includes a plurality of isolated conductive patterns in a substantially rectangular shape arranged such that the predetermined gaps extend substantially linearly and cross at angles with each other.

7. The semiconductor apparatus of claim 6, wherein the semiconductor chip is rectangular, and
   wherein the plurality of predetermined gaps crossing substantially linearly are disposed so as to define predetermined angles against an external edge of the semiconductor chip.

8. The semiconductor apparatus of claim 2, further comprising:
   a through-hole extending between the one side and the other side of the substrate and electrically connecting the semiconductor chip and the first electrode; and
   an insulating resin covering the one side of the substrate.

9. The semiconductor apparatus of claim 2, wherein the first coil is a rolled conductive foil fixedly secured to the other side of the substrate.

10. A semiconductor apparatus, comprising:
    a substrate;
    a semiconductor chip disposed on one side of the substrate;
    a first coil in a spiral shape formed on a surface of the one side of the substrate facing to the semiconductor chip, the first coil electrically connected to the semiconductor chip;
    a first electrode formed on a surface of the other side of the substrate and electrically connected to the first coil; and
    a second electrode formed on a surface of the other side of the substrate and electrically connectable to the first electrode, the second electrode electrically connectable to a second coil on the outside of the semiconductor apparatus,
    wherein the second electrode is electrically connected to the first electrode to obtain inductance composed of the first coil, and
    wherein the second electrode is electrically connected to the first electrode and the second coil to obtain inductance composed of the first coil and the second coil.

11. The semiconductor apparatus of claim 10, further comprising a conductive pattern formed on a surface of the other side of the substrate opposite to the first coil for stabilizing an inductance characteristic of the first coil.

12. The semiconductor apparatus of claim 11, further comprising a plurality of electrodes formed on a surface of the other side of the substrate for maintaining the conductive pattern to the same voltage.

13. The semiconductor apparatus of claim 12, wherein the plurality of electrodes are grounded.

14. The semiconductor apparatus of claim 11, further comprising:
    a through-hole extending between the one side and the other side of the substrate and electrically connecting the first coil and the first electrode; and
    an insulating resin covering the one side of the substrate.

15. The semiconductor apparatus of claim 11, wherein the first coil is a rolled conductive foil fixedly secured to a surface of the one side of the substrate.

16. The semiconductor apparatus of claim 10, wherein the semiconductor chip is fixedly secured to the substrate via an insulating adhesive.

17. A semiconductor apparatus, comprising:
    a substrate;
    a semiconductor chip disposed on one side of the substrate;
    a first coil in a spiral shape formed on a surface of the one side of the substrate facing to the semiconductor chip, the first coil electrically connected to the semiconductor chip;
    a first electrode formed on a surface of the other side of the substrate and electrically connected to the first coil; and
    a second electrode formed on a surface of the other side of the substrate and electrically connectable to the first electrode, the second electrode electrically connectable to the second coil on the outside of the semiconductor apparatus, wherein the second electrode is electrically connected to the first electrode and the second coil to obtain inductance composed of the first coil and the second coil, and wherein the first coil is composed of a third coil and a fourth coil, and wherein the third coil and the fourth coil have a line-symmetry shape relative to a boundary dividing a surface of the substrate facing to the semiconductor chip in two.

18. A semiconductor apparatus, comprising:

a substrate;

a semiconductor chip disposed on one side of the substrate;

a first coil in a spiral shape formed on a surface of the one side of the substrate facing to the semiconductor chip, the first coil electrically connected to the semiconductor chip;

a first electrode formed on a surface of the other side of the substrate and electrically connected to the first coil;

a second electrode formed on a surface of the other side of the substrate and electrically connectable to the first electrode, the second electrode electrically connectable to the second coil on the outside of the semiconductor apparatus;

a conductive pattern formed on a surface of the other side of the substrate opposite to the first coil for stabilizing an inductance characteristic of the first coil; and an auxiliary conductive pattern intervening between the semiconductor chip on the one side of the substrate and the insulating adhesive for stabilizing an inductance characteristic of the first coil, wherein the second electrode is electrically connected to the first electrode and the second coil to obtain inductance composed of the first coil and the second coil.

* * * * *